(12) United States Patent
Karino

(10) Patent No.: US 10,483,347 B2
(45) Date of Patent: Nov. 19, 2019

(54) SEMICONDUCTOR DEVICE, STARTER CIRCUIT, AND SWITCHED-MODE POWER-SUPPLY CIRCUIT

(71) Applicant: FUJI ELECTRIC CO., LTD., Kawasaki (JP)

(72) Inventor: Taichi Karino, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/046,490

(22) Filed: Jul. 26, 2018

(65) Prior Publication Data

US 2019/0081135 A1 Mar. 14, 2019

(30) Foreign Application Priority Data

Sep. 11, 2017 (JP) ................. 2017-173841

(51) Int. Cl.
*H01L 29/06* (2006.01)
*H01L 29/808* (2006.01)
*H01L 29/08* (2006.01)
*H02M 3/335* (2006.01)
*H01L 29/10* (2006.01)
(Continued)

(52) U.S. Cl.
CPC ...... *H01L 29/0615* (2013.01); *H01L 27/0248* (2013.01); *H01L 28/20* (2013.01); *H01L 29/0696* (2013.01); *H01L 29/0865* (2013.01); *H01L 29/0882* (2013.01); *H01L 29/1066* (2013.01); *H01L 29/1095* (2013.01); *H01L 29/405* (2013.01); *H01L 29/808* (2013.01); *H02M 1/36* (2013.01); *H02M 3/33523* (2013.01); *H01L 29/0619* (2013.01); *H02M 2001/0006* (2013.01)

(58) Field of Classification Search
None
See application file for complete search history.

(56) References Cited

U.S. PATENT DOCUMENTS 7,306,999 B2 * 12/2007 Hall ................. H01L 27/0288
257/528
2008/0117653 A1 * 5/2008 Saito ................. H01L 29/405
363/20

(Continued)

FOREIGN PATENT DOCUMENTS

JP 2008-153636 7/2008
JP 2015-135844 7/2015

*Primary Examiner* — Evren Seven

(57) ABSTRACT

A semiconductor device includes a p-type semiconductor substrate; an n-type drift layer on the substrate; an n-type drain region in contact with the drift layer to be provided on the semiconductor substrate at a center of the drift layer; a p-type gate region on the substrate in an outer side of the drift layer, the gate region including U-shaped first and second concave patterns in a planar pattern, each having entrances of the U-shapes located with equal distances from the drain region, the bottoms of the U-shapes protruding toward an outer side of the planar pattern; n-type source regions in an inner side of the first concave patterns, each of the source regions contacts with the drift layer and the gate region; and n-type surge-current guiding-regions in an inner side of the second concave patterns, each of the surge-current guiding-regions contacts with the drift layer and the gate region.

16 Claims, 15 Drawing Sheets

(51) Int. Cl.
*H01L 49/02* (2006.01)
*H02M 1/36* (2007.01)
*H01L 29/40* (2006.01)
*H01L 27/02* (2006.01)
*H02M 1/00* (2006.01)

(56) References Cited

U.S. PATENT DOCUMENTS

| | | | |
|---|---|---|---|
| 2012/0161231 A1* | 6/2012 | Tamaki | H01L 24/05 257/335 |
| 2014/0346528 A1* | 11/2014 | Hisada | H01L 29/1608 257/77 |
| 2015/0200309 A1 | 7/2015 | Karino et al. | |
| 2015/0228641 A1* | 8/2015 | Saito | H01L 29/808 257/337 |
| 2015/0333158 A1* | 11/2015 | Tsuchiko | H01L 29/1066 438/188 |
| 2016/0293777 A1* | 10/2016 | Knaipp | H01L 29/404 |
| 2017/0062415 A1* | 3/2017 | Mallikarjunaswamy | H01L 29/7823 |
| 2017/0213917 A1* | 7/2017 | Bhalla | H01L 29/1066 |
| 2017/0338354 A1* | 11/2017 | Fujie | H01L 29/808 |
| 2017/0352753 A1* | 12/2017 | Nagahisa et al. | H01L 29/1066 |
| 2018/0019332 A1* | 1/2018 | Jeon | H01L 23/4952 |

* cited by examiner

US 10,483,347 B2

SEMICONDUCTOR DEVICE, STARTER CIRCUIT, AND SWITCHED-MODE POWER-SUPPLY CIRCUIT

CROSS-REFERENCE TO RELATED APPLICATIONS

This application claims benefit to priority under 35 U.S.C. § 119 to Japanese Patent Application No. 2017-173841, filed on Sep. 11, 2017, the entire contents of which is incorporated by reference herein.

BACKGROUND OF THE INVENTION

1. Field of the Invention

The present invention relates to semiconductor devices, more particularly to a junction transistor.

2. Description of the Related Art

JP 2015-135844A discloses a lateral junction field effect transistor (JFET) exhibiting high breakdown voltage, the JFET including a drain region and an input pad connected to the drain region allocated in the middle of a circular planar pattern, and a plurality of source regions on the periphery of the circular planar pattern. JP 2008-153636A discloses a JFET having a structure similar to the structure disclosed in JP 2015-135844A, the JFET includes a resistor made of a polysilicon film, for example, and the resistor is delineated above an oxide film on a drift layer and connected in parallel to an input pad. The resistor has a function of detecting an input voltage (a brownout function).

For testing a surge withstand capability (SWC) for an electrostatic discharge (ESD) (hereinafter, referred to as an "SWC") in a semiconductor device, two types of models are commonly used, which are a machine model (MM±) and a human body model (HBM±). The MM+ uses a relatively low voltage of approximately 200 volts. The JFET as disclosed in JP 2015-135844A and JP 2008-153636A can withstand the voltage level of the MM+ and therefore can be protected against the ESD surge.

As compared with the MM+, the HBM+ uses a relatively high voltage of approximately 1000 volts to 2000 volts. Source potential increases as a surge voltage applied to the JFET increases. The JFET disclosed in JP 2015-135844A is protected against the ESD surge until the surge voltage reaches the source breakdown voltage or the breakdown voltage of the circuit element connected to the source region to implement the starter circuit. Moreover, in the JFET disclosed in JP 2008-153636A, there is a difference in potential-transmission behavior with respect to the applied ESD surge of the HBM+ between the potential through the resistor used for the brownout function and the potential due to a depletion layer in silicon, and which leads to a potential difference in the oxide film below the resistor. The JFET disclosed in JP 2008-153636A is protected against the applied ESD surge of the HBM+ until the surge voltage reaches a level of the breakdown voltage of the oxide film. However, when the potential difference increases, the oxide film is damaged.

It is difficult to provide a space for arranging an element for protecting against the ESD surge in parallel to the JFET disclosed in JP 2015-135844A and JP 2008-153636A, since the JFET serving as a starter element itself is provided with the input pad. In order to improve the SWC, it is conceivable to increase the resistance by increasing a distance between the input pad and the source region and increasing a size of the device, so as to suppress the rise in source potential and the potential difference occurring in the oxide film. However, as the size of the device increases, the entire cost increases.

SUMMARY OF THE INVENTION

In order to achieve the object, an aspect of the present invention inheres in a semiconductor device encompassing: (a) a semiconductor substrate of a first conductivity type; (b) a drift layer of a second conductivity type provided on the semiconductor substrate; (c) a drain region of the second conductivity type penetrating the drift layer to be provided on the semiconductor substrate at a center of the drift layer; (d) a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern; (e) source regions of the second conductivity type provided in an inner side of the first concave patterns, each of the source regions contacts with the drift layer and the gate region; and (f) surge-current guiding-regions of the second conductivity type provided in an inner side of the second concave patterns, each of the surge-current guiding-regions contacts with the drift layer and the gate region.

Another aspect of the present invention inheres in a starter circuit including a semiconductor device, the semiconductor device encompassing: (a) a semiconductor substrate of a first conductivity type; (b) a drift layer of a second conductivity type provided on the semiconductor substrate; (c) a drain region of the second conductivity type penetrating the drift layer to be provided on the semiconductor substrate at a center of the drift layer; (d) a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern; (e) source regions of the second conductivity type provided in an inner side of the first concave patterns, each of the source regions contacts with the drift layer and the gate region; and (f) surge-current guiding-regions of the second conductivity type provided in an inner side of the second concave patterns, each of the surge-current guiding-regions contacts with the drift layer and the gate region.

Still another aspect of the present invention inheres in a switched-mode power-supply circuit including a starter circuit having a semiconductor device, the semiconductor device encompassing: (a) a semiconductor substrate of a first conductivity type; (b) a drift layer of a second conductivity type provided on the semiconductor substrate; (c) a drain region of the second conductivity type penetrating the drift layer to be provided on the semiconductor substrate at a center of the drift layer; (d) a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern; (e) source regions of the second conductivity type provided in an inner side of the first concave patterns, each of the source regions contacts with the drift layer and the gate region; and (f) surge-current guiding-regions of the second conductivity type provided in an inner side of the second concave patterns, each of the surge-current guiding-regions contacts with the drift layer and the gate region.

DETAILED DESCRIPTION

Figure 1:
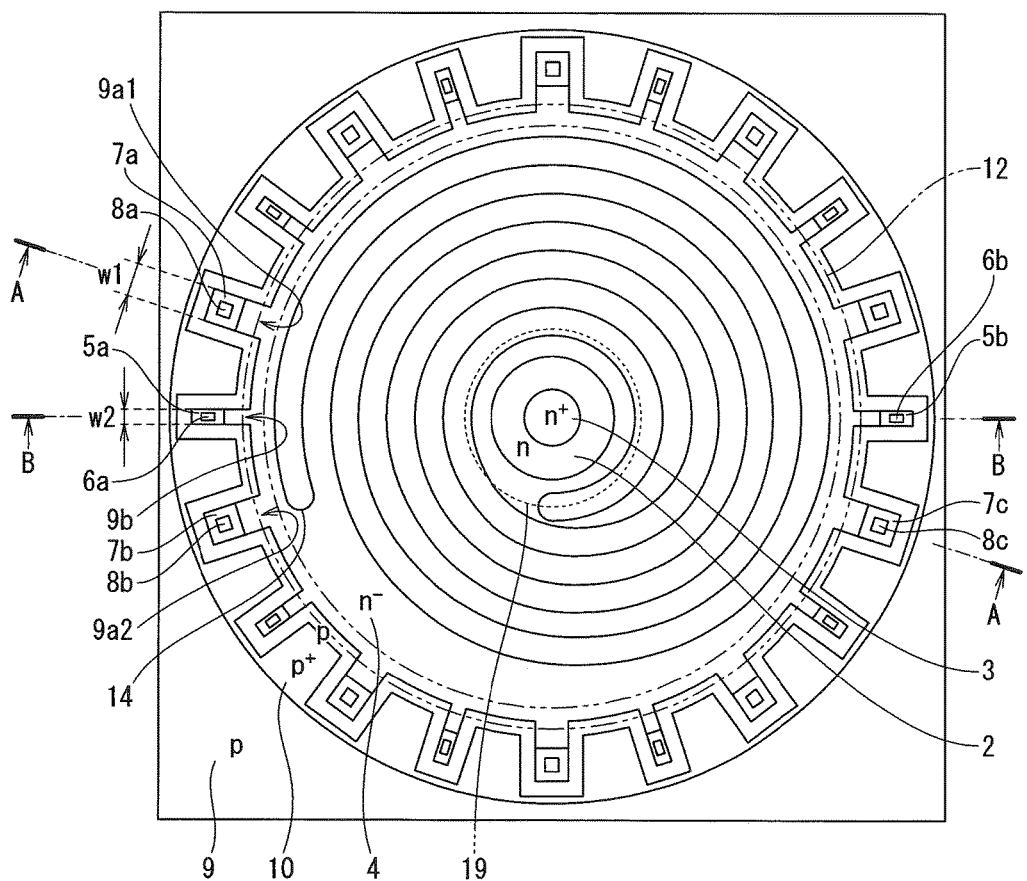
FIG. 1 is a schematic top view illustrating a part of a semiconductor device according to a first embodiment of the present invention.

Exemplary embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

In the following descriptions, the terms relating to directions, such as "left and right" and "up and down" are merely defined for illustration purposes, and thus, such definitions do not limit the technical spirit of the present invention. Therefore, for example, when the paper plane is rotated by 90 degrees, the "left and right" and the "up and down" are read in exchange. When the paper plane is rotated by 180 degrees, the "left" is changed to the "right", and the "right" is changed to the "left". In the Specification and the appended drawings, the superscript "+" or "−" added to the mark "n" or "p" denotes that a semiconductor region has a higher or lower impurity concentration than a region without the superscript "+" or "−" added. It should be noted that semiconductor regions denoted by the same mark, such as "n", do not necessarily have exactly the same impurity concentration.

<First Embodiment>

Figure 2:
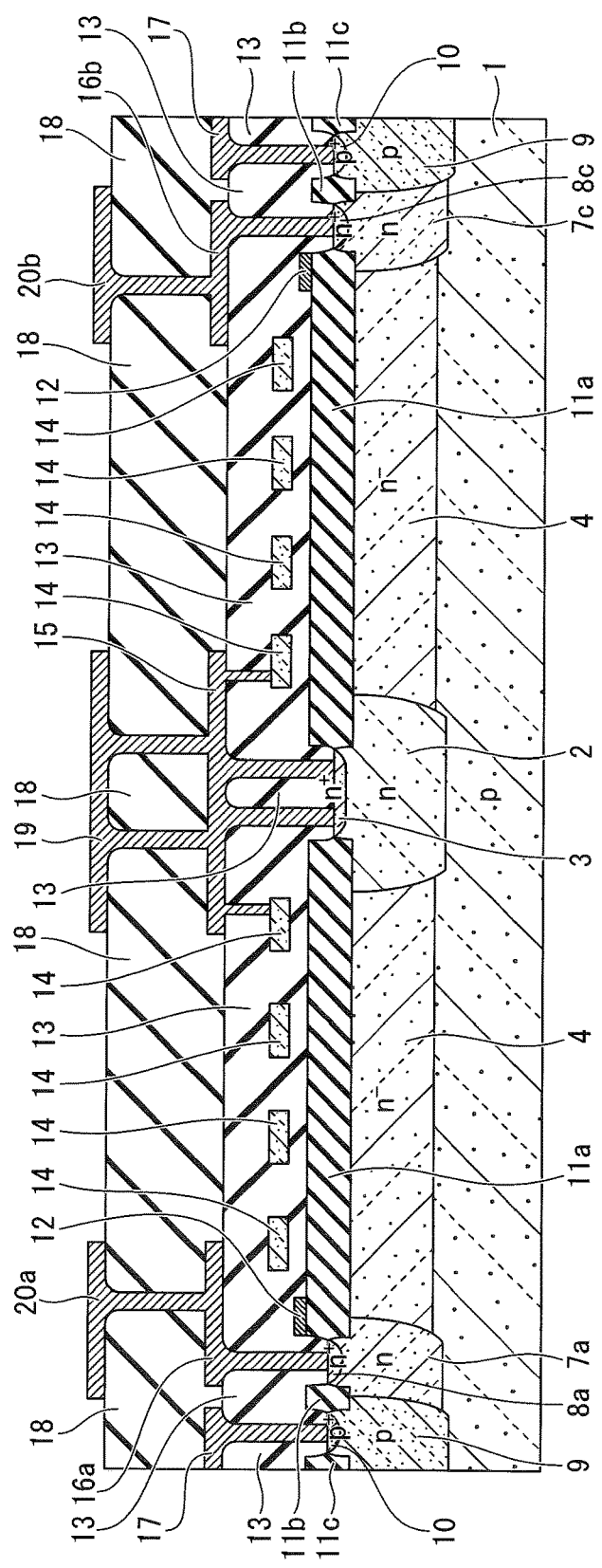
FIG. 2 is a cross-sectional view taken along line II-II of FIG. 1.

A semiconductor device according to a first embodiment is a high-breakdown-voltage JFET which is used as a starter element for a starter circuit included in a switched-mode power-supply circuit. As illustrated in FIG. 1, the semiconductor device according to the first embodiment includes an n-type drain region 2 having a circular shape disposed in the middle of the planar pattern. An n⁺-type drain contact region 3 having a higher impurity concentration than the drain region 2 is disposed at a center of the drain region 2. And, as illustrated in FIG. 2, an input pad 19 having a circular shape is connected to an upper portion of the drain contact region 3. The outer shape of the input pad 19 is indicated by the broken line in FIG. 1.

A ring-shaped n⁻-type drain drift layer 4 (hereinafter, referred to as the "drift layer 4") having a lower impurity concentration than the drain region 2 is provided in contact with the outer side of the drain region 2. As illustrated in FIG. 2, a resistor pattern 14 having a spiral shape, used for realizing a brownout (BO) function to detect an input voltage is provided over the drift layer 4 and connected in parallel to the input pad 19. As illustrated in planar pattern of FIG. 1, the resistor pattern 14 winds around the drain region 2 and the drain contact region 3.

In the planar pattern illustrated in FIG. 1, a p-type gate region 9 is provided on the outer side of an area occupied by the drift layer 4 at the opposite side of the drain region 2. The gate region 9 is provided with a plurality of first concave patterns 9a1 and 9a2 and a plurality of second concave patterns 9b, each of the bottoms of the concaves protruding toward the outer side, and the concaves are arranged alternately at regular intervals implementing a circle along an inner edge of the gate region 9. Although the cross-sectional views are not illustrated in FIG. 2, the first concave patterns 9a1 and 9a2 and the second concave patterns 9b extend in the thickness direction of the semiconductor device. The first concave patterns 9a1 and 9a2 and the second concave patterns 9b have a U-shape in a planar pattern. Changing the view point, the planer pattern of the gate region 9 is considered to be provided with regions projecting to the inner side toward the drift layer 4 and alternately interposed between the first concave patterns 9a1 and 9a2 and the second concave patterns 9b so as to have a comb-shape along the entire inner edge of the gate region 9.

As illustrated in FIG. 2, a gate contact region 10 of p-type (p⁺) having a higher impurity concentration than the gate region 9 is disposed in contact with a top surface of the gate region 9. And as can be understand from the plan view illustrated in FIG. 1, the gate contact region 10 is arranged in each of the projecting portions of the gate region 9 so as to implement a comb-shape circular pattern. The outer edge of the gate contact region 10 is formed into a circular shape. Due to the comb-shape of the inner edge of the gate region 9, the inner edge of the gate contact region 10 is separated by a predetermined distance from the inner edge of the gate region 9.

In addition, for convenience of description, FIG. 1 does not illustrate other elements implementing the semiconductor device, such as an isolation layer, an interlayer insulating film, and the like, arranged above the drain contact region 3, source contact regions 8a, 8b, 8c, and the gate contact region 10, except for the resistor pattern 14. The other elements will be described below with reference to FIG. 2.

FIG. 1 exemplifies the semiconductor device provided with ten first concave patterns 9a1 and 9a2 and ten second concave patterns 9b defined from the inner-edge line of the gate region 9. The first concave patterns 9a1 and 9a2 and the second concave patterns 9b are alternately and repeatedly arranged at regular intervals. In particular, each second concave pattern 9b is interposed between a pair of the first concave patterns 9a1 and 9a2 adjacent to each other so as to be arranged in every other space.

The entrances of the U-shapes defining the topology of the first concave patterns 9a1 and 9a2 and the entrances of the U-shapes defining the topology of the second concave patterns 9b are arranged along an arc of the circle having the center at a position concentric with the circle of the drain region 2. All of the entrances of the U-shapes defining the topology of the first concave patterns 9a1 and 9a2 and the second concave patterns 9b are thus located at equal distances from the drain region 2.

The bottoms of the U-shapes defining the topology of the first concave patterns 9a1 and 9a2 and the bottoms of the U-shapes defining the topology of the second concave patterns 9b are also arranged along an arc of the circle having the center at a position concentric with the circle of the drain region 2. Each depth of the first concave patterns 9a1 and 9a2 is substantially equal to each depth of the second concave patterns 9b. Each depth of the first concave patterns 9a1 and 9a2 and each depth of the second concave patterns 9b correspond to the length measured in the diameter direction of the semiconductor device. Each of the entrances of the U-shapes of the first concave patterns 9a1 and 9a2 has a predetermined width w1, and each of the entrances of the U-shapes of the second concave patterns 9b has a width w2 which is narrower than the width w1 of the entrances of the U-shapes of the first concave patterns 9a1 and 9a2.

Figure 6:
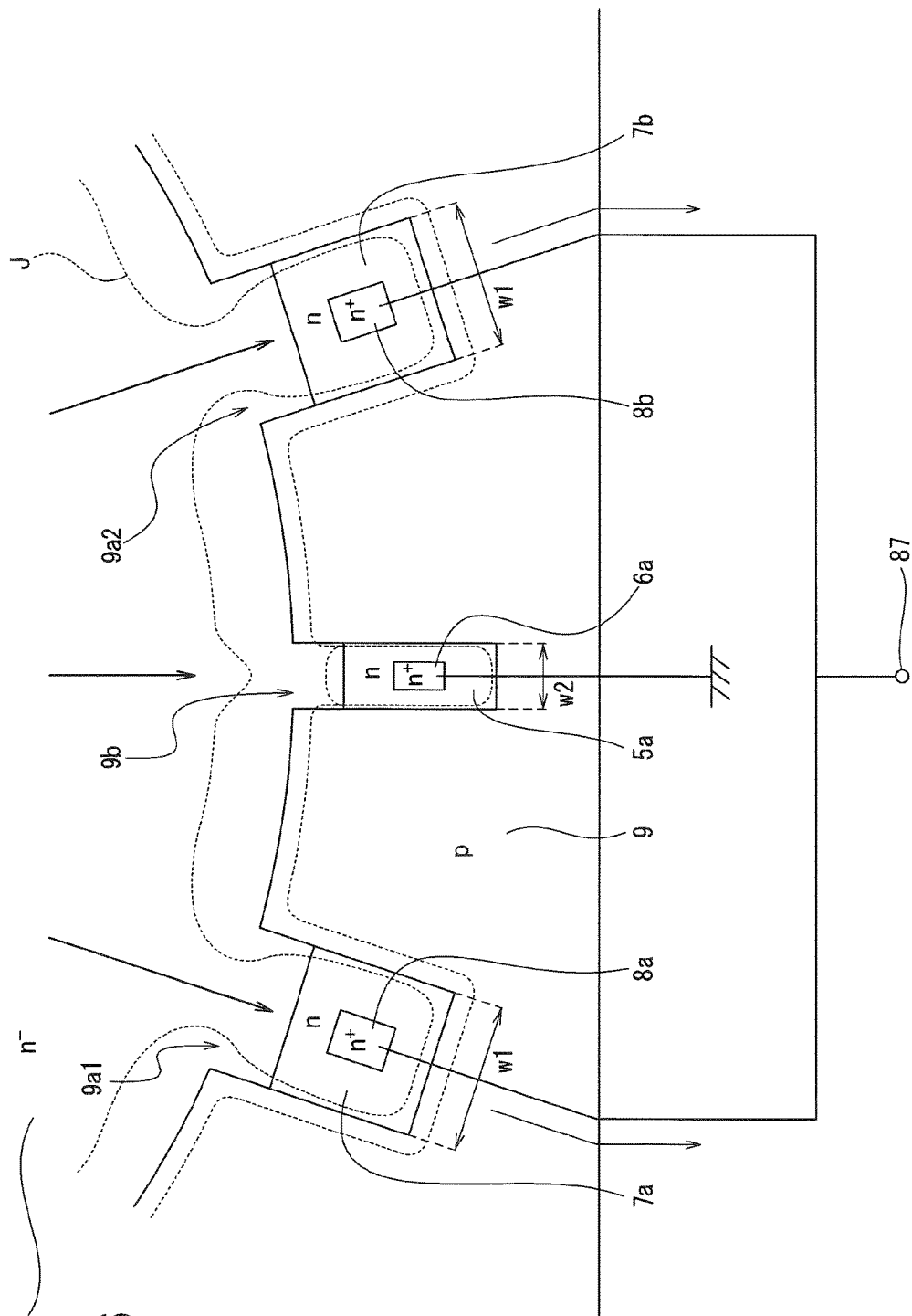
FIG. 6 is a schematic plan view illustrating a state in which a current is cut off first in a surge-current guiding-region during normal operation in the semiconductor device according to the first embodiment.

FIG. 1 illustrates a ring-shape gate electrode 12 arranged along the outer periphery of the drift layer 4 by a two-dot chain line. As illustrated in FIG. 6, a plurality of n-type source regions 7a, 7b, and 7c having a rectangular shape in a planar pattern is arranged in the inner sides of the first concave patterns 9a1 and 9a2, respectively. The n-type source regions 7a, 7b, and 7c are respectively contacted with the drift layer 4 and the gate region 9 at the inner sides of the first concave patterns 9a1 and 9a2. The drift layer 4 extends slightly to the inside of the first concave patterns 9a1 and 9a2 via the entrances of the U-shapes. Excluding one side, which is in contact with the drift layer 4, the three sides of the respective rectangular source regions 7a, 7b, and 7c are surrounded by the gate region 9. The rectangular of n⁺-type source contact regions 8a, 8b, and 8c having a higher impurity concentration than the source regions 7a, 7b, and 7c are assigned in the middle of the source regions 7a, 7b, and 7c, respectively, as illustrated in FIG. 1. The n⁺-type source contact regions 8a, 8b, and 8c are buried at the top surface of the source regions 7a, 7b, and 7c as can be understood from the cross-sectional view illustrated in FIG. 2.

A plurality of n-type surge-current guiding-regions 5a and 5b having a rectangular shape in a planar pattern contacts with the drift layer 4 and the gate region 9 in the inner sides of the second concave patterns 9b. The drift layer 4 extends slightly to the inside of the second concave patterns 9b via the entrances of the U-shapes. Excluding one side, which is in contact with the drift layer 4, the three sides of the respective rectangular surge-current guiding-regions 5a and 5b are surrounded by the gate region 9 in the same manner as the source regions 7a, 7b, and 7c. As illustrated in FIG. 1, rectangular surge-current guiding contact-regions 6a and 6b of n⁺-type having a higher impurity concentration than the surge-current guiding-regions 5a and 5b are assigned in the middle of the surge-current guiding-regions 5a and 5b, respectively. As illustrated in FIG. 2, the surge-current guiding contact-regions 6a and 6b are buried at the top surface of the surge-current guiding-regions 5a and 5b.

In the high-breakdown-voltage JFET as illustrated in FIG. 1, the circle along the outer edge of the drain region 2, the circle along the outer edge of the drain contact region 3, the circle along the outer edge of the input pad 19, and the circle along the outer edge of the gate contact region 10 are arranged concentrically with each other. The center of the one side of the respective rectangular surge-current guiding-regions 5a and 5b on the drift layer 4 side and the center of the one side of the respective rectangular source regions 7a, 7b, and 7c on the drift layer 4 side are located on an arc of the circle having the center at the position concentric with the circle of the drain region 2. The surge-current guiding-regions 5a and 5b and the source regions 7a, 7b, and 7c are thus located at equal distances from the drain region 2. Consequently, a current path from the drain region 2 to the source regions 7a, 7b, and 7c via the drift layer 4 in the radial direction has the same length as current paths from the drain region 2 to the surge-current guiding-regions 5a and 5b via the drift layer 4 in the radial direction.

As illustrated in FIG. 2, the drain region 2, the drift layer 4, the source regions 7a and 7b, and the gate region 9 are buried at a top surface of a p-type semiconductor substrate 1. The drain region 2, the drift layer 4, and the source regions 7a and 7b may be doped by ion plantation of n-type impurity ions, such as phosphorus (P) with activation annealing after the implantation, and the like, so as to provide n-type doped region having a predetermined impurity concentration on the top surface of the p-type semiconductor substrate 1. Similarly, the drain contact region 3 and the source contact regions 8a and 8b may be doped by the ion plantation of the n-type impurity ions, the following activation annealing, and the like, so as to provide n-type doped region having a higher impurity concentration at the upper portions of the drain region 2 and the source regions 7a and 7b.

The gate region 9 may be doped by ion plantation of p-type impurity ions, such as boron (B) with activation annealing after the implantation, and the like so as to provide a p-type doped region having a predetermined impurity concentration at the top surface and in the p-type semiconductor substrate 1. Similarly, the gate contact region 10 may be doped by the ion plantation of the p-type impurity ions with the following activation annealing, and the like, so as to provide a p-type doped region having a higher impurity concentration at the upper portion of the gate region 9.

The drift layer 4 is provided to surround the drain region 2 in the lateral direction (in the left-right direction in FIG. 2). Ring-shaped LOCal-Oxidation-of-Silicon (LOCOS) oxide films serving as isolation layers 11a, 11b, and 11c are provided on the drain region 2 and the drift layer 4. The gate electrode 12 made of a polysilicon film or the like is disposed at the outer edge on the top surface of the isolation layer 11a allocated in the inner side.

A first interlayer insulating film 13 made of an oxide film or the like is provided on the drain contact region 3, the isolation layers 11a, 11b, and 11c, the source contact regions 8a and 8b, and the gate contact region 10. The resistor pattern 14 are buried in the first interlayer insulating film 13 provided on the drift layer 4.

A disk-shaped drain electrode 15 is disposed on the top surface of the first interlayer insulating film 13 on the drain contact region 3. The drain electrode 15 is electrically connected to the drain contact region 3 via-wiring embedded in a via-hole penetrating the first interlayer insulating film 13 between the drain electrode 15 and the drain contact region 3. The drain electrode 15 is also electrically connected to a drain-region side-edge of the resistor pattern 14 via-wiring embedded in a via-hole penetrating the first interlayer insulating film 13.

Source electrodes 16a and 16b are disposed on the top surface of the first interlayer insulating film 13 on the source contact regions 8a and 8b. The source electrodes 16a and 16b are electrically connected to the source contact regions 8a and 8b via-wiring embedded in via-holes penetrating the first interlayer insulating film 13 between the source electrodes 16a, 16b and the source contact regions 8a, 8b.

A ring-shaped gate-electrode wire 17 is laminated on the top surface of the first interlayer insulating film 13 on the gate contact region 10. The gate-electrode wire 17 is connected to the gate electrode 12. The gate-electrode wire 17 is electrically connected to the gate contact region 10 via-wiring embedded in a via-hole penetrating the first interlayer insulating film 13 between the gate-electrode wire 17 and the gate region 9. Although a wiring structure is not illustrated in FIG. 2, the gate electrode 12 disposed on the isolation layer 11a is also electrically connected to the gate-electrode wire 17. The gate-electrode wire 17 is electrically connected to wiring (not illustrated) used for connection to ground potential. The wiring for the connection to the ground potential (not illustrated) is electrically connected to the drain-region side-edge of the resistor pattern 14 via-wiring embedded in a via-hole penetrating the first interlayer insulating film 13.

A second interlayer insulating film 18 made of an oxide film or the like is provided over the drain electrode 15, the first interlayer insulating film 13, the source electrodes 16a, 16b, and the gate electrode 12. The input pad 19 is disposed on the top surface of the second interlayer insulating film 18 above the drain electrode 15. The input pad 19 is electrically connected to the drain electrode 15 via-wiring embedded in a via-hole penetrating the second interlayer insulating film 18 between the input pad 19 and the drain electrode 15. The drain region 2 is electrically connected to a high-voltage input terminal of the switched-mode power-supply circuit via the input pad 19 serving as drain-electrode wiring.

Source wires 20a and 20b are disposed on the top surface of the second interlayer insulating film 18 on the source electrodes 16a and 16b. The source wires 20a and 20b are electrically connected to the source electrodes 16a and 16b via-wiring embedded in via-holes penetrating the second interlayer insulating film 18 between the source wires 20a, 20b and the source electrodes 16a, 16b. The source regions 7a and 7b are electrically connected to an external starter circuit via the source electrodes 16a and 16b.

Figure 3:
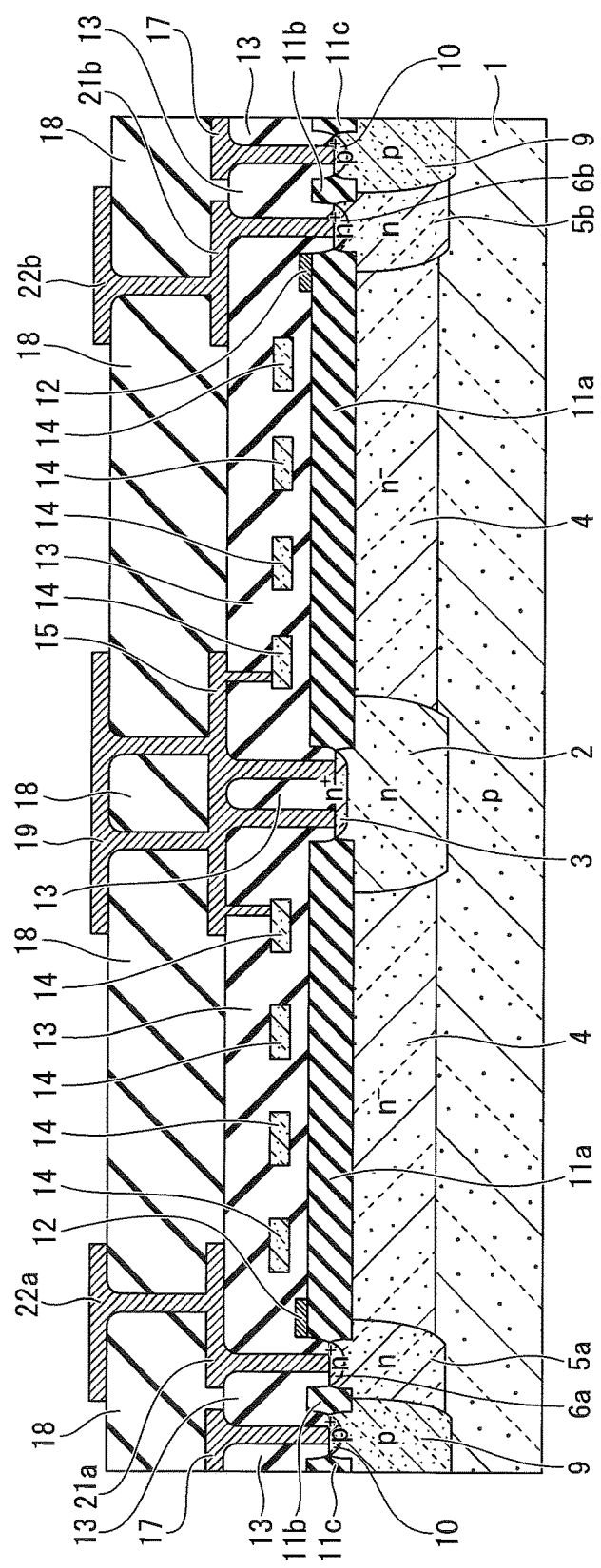
FIG. 3 is a cross-sectional view taken along line III-III of FIG. 1.

As illustrated in FIG. 3, surge-current guiding-electrodes 21a and 21b are disposed on the top surface of the first interlayer insulating film 13 above the surge-current guiding-regions 5a and 5b. The surge-current guiding-electrodes 21a and 21b are electrically connected to the surge-current guiding contact-regions 6a and 6b via-wiring embedded in via-holes penetrating the first interlayer insulating film 13 between the surge-current guiding-electrodes 21a, 21b and the surge-current guiding contact-regions 6a, 6b.

Surge-current guiding-wires 22a and 22b are disposed on the top surface of the second interlayer insulating film 18 above the surge-current guiding-electrodes 21a and 21b. The surge-current guiding-wires 22a and 22b are electrically connected to the surge-current guiding-electrodes 21a and 21b via-wiring embedded in via-holes penetrating the second interlayer insulating film 18 between the surge-current guiding-wires 22a, 22b and the surge-current guiding-electrodes 21a, 21b. The surge-current guiding-wires 22a and 22b are electrically connected to wiring (not illustrated) used for connection to the ground potential. The surge-current guiding-wires 22a and 22b may be connected to the gate-electrode wire 17. In such a case, the gate-electrode wire 17 is not necessarily connected to the wiring used for the connection to the ground potential.

As described below, the width w2 is set to be narrower than the width w1 so that pinch-off occurs in the drift layer 4 at the entrances of the U-shapes defining the topology of the second concave patterns 9b between the surge-current guiding-regions 5a, 5b and the drain region 2 earlier than in the drain layer 4 at the entrances of the U-shapes defining the topology of the first concave patterns 9a1 and 9a2 between the source regions 7a, 7b and the drain region 2. The pinch-off preferably occurs at the entrances of the U-shapes of the second concave patterns 9b reliably earlier than at the entrances of the U-shapes of the first concave patterns 9a1 and 9a2. From this viewpoint, the width w2 is more preferably less than or equal to one-third of the width w1.

Figure 4:
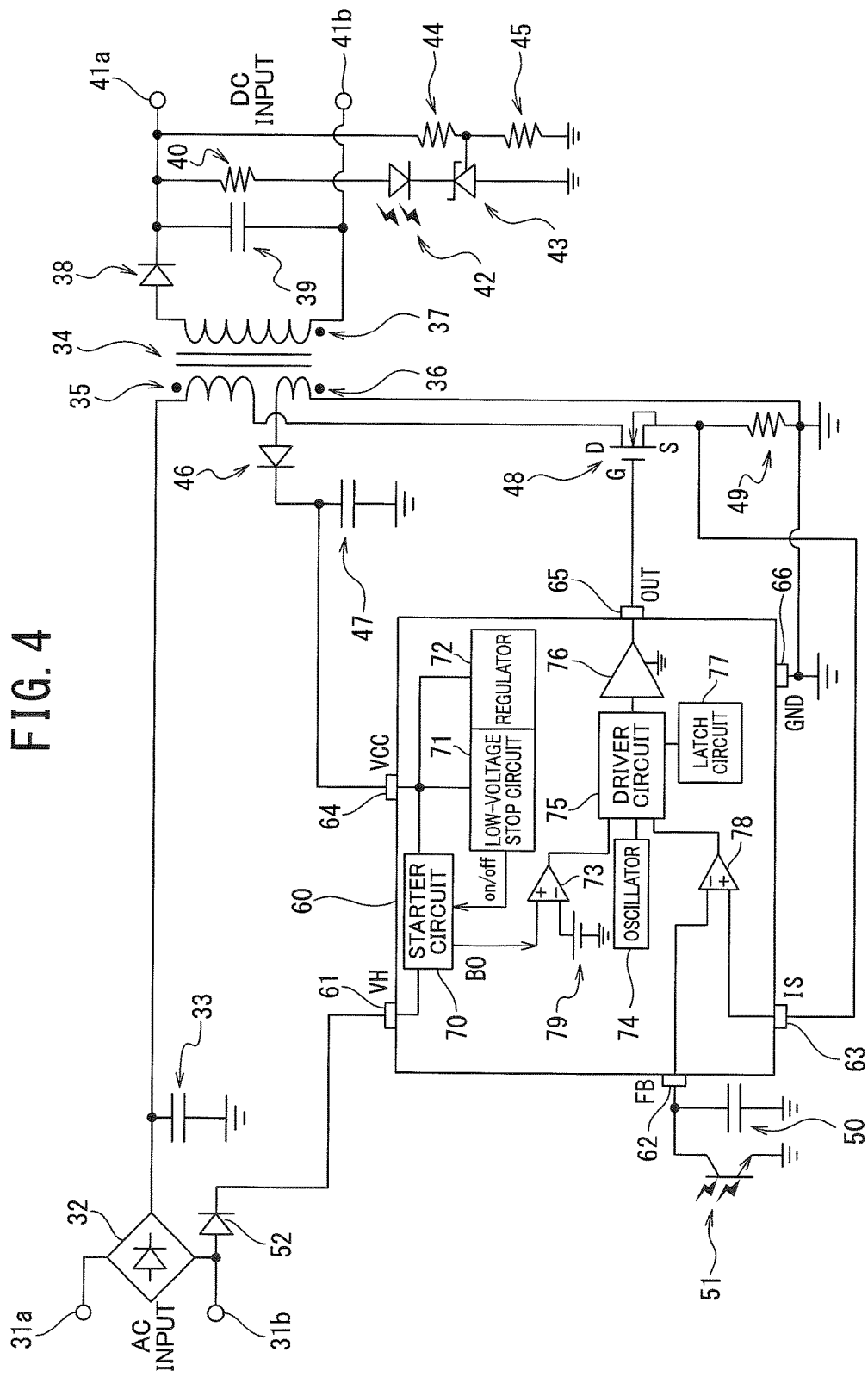
FIG. 4 is a circuit diagram schematically illustrating a switched-mode power-supply circuit using the semiconductor device according to the first embodiment.

Next, a starter circuit mounted with the high-breakdown-voltage JFET as a starter element which is the semiconductor device according to the first embodiment and a switched-mode power-supply circuit connected to the starter circuit, will be described in detail below. As illustrated in FIG. 4, the switched-mode power-supply circuit includes a rectifier 32 implementing a bridge circuit connected to a pair of input terminals 31a and 31b, and a smoothing capacitor 33 connected to the rectifier 32 to smooth a full-wave rectified current fed from the rectifier 32. An alternating current signal, such as 100 volts or 200 volts, is applied through the pair of the input terminals 31a and 31b.

A primary main coil 35 of a transformer 34 is connected to the rectifier 32 and the smoothing capacitor 33. A cathode of a diode 52 for preventing backflow is connected to the input terminal 31b on the lower side of the pair of the input terminals 31a and 31b in FIG. 4 and the rectifier 32. An anode of the diode 52 is connected to a control IC 60 for controlling and protecting the switched-mode power-supply circuit.

The switched-mode power-supply circuit further includes a power-supply capacitor 47 serving as a DC power supply of the control IC 60, and a MOS-transistor 48 serving as a switching element for controlling a current flowing through a primary auxiliary coil 36 of the transformer 34. The power-supply capacitor 47 is connected to the control IC 60 via a power-supply terminal 64 of the control IC 60. A gate of the MOS-transistor 48 is connected to the control IC 60 via a gate-output terminal 65 of the control IC 60. A drain terminal of the MOS-transistor 48 is connected to one end of the primary main coil 35 of the transformer 34, and a source terminal of the MOS-transistor 48 is connected to one end of each of a current-sense terminal 63 and a resistor pattern 49 of the control IC 60. The other end of the resistor pattern 49 is grounded. The resistor pattern 49 converts a current signal of a current flowing through the MOS-transistor 48 to a voltage signal, so that a voltage of the converted voltage signal is applied to the current-sense terminal 63.

One end of the primary auxiliary coil 36 of the transformer 34 is connected in parallel to an anode of a rectifier diode 46, and the other end of the primary auxiliary coil 36 is grounded. A current induced by switching operation of the MOS-transistor 48 flows through the primary auxiliary coil 36. A cathode of the rectifier diode 46 is connected between the power-supply capacitor 47 and the power-supply terminal 64 of the control IC 60. The rectifier diode 46 rectifies the current flowing through the primary auxiliary coil 36 to charge the power-supply capacitor 47. The power-supply capacitor 47 serves as a DC power supply for facilitating the continuation of the switching operation of the MOS-transistor 48.

A voltage is induced in a secondary coil 37 of the transformer 34 on the basis of a voltage across the power-supply capacitor 47 by the switching operation of the MOS-transistor 48. One end of the secondary coil 37 is connected to an anode of a rectifier diode 38. A cathode of the rectifier diode 38 and the other end of the secondary coil 37 are connected to a pair of output terminals 41a and 41b. An output capacitor 39 is connected between the cathode of the rectifier diode 38 and the other end of the secondary coil 37.

Two resistor patterns 44 and 45 implementing a series resistor circuit are connected to a connection node between the anode of the rectifier diode 38 and the output terminal 41a on the upper side of the pair of the output terminals 41a and 41b in FIG. 4. One end of a resistor pattern 40 is connected to the connection node in parallel to the series resistor circuit. The other end of the resistor pattern 40 is connected to an anode of a photodiode 42, and a cathode of the photodiode 42 is connected to a cathode of a shunt regulator 43. An anode of the shunt regulator 43 is grounded.

An optical signal is transmitted from the light-emitting diode 42, and the output optical signal is received by a phototransistor 51 connected to the control IC 60 as indicated on the lower left side in FIG. 4. The phototransistor 51 and the light-emitting diode 42 implement a photocoupler. The optical signal received by the phototransistor 51 is a feedback signal for the control IC 60. The phototransistor 51 is connected to a feedback terminal 62 of the control IC 60 so that the feedback signal is fed to the control IC 60 via the feedback terminal 62. A capacitor 50 serving as a noise filter with respect to the feedback signal is connected to the phototransistor 51.

The control IC 60 includes a starter circuit 70, a low-voltage stop circuit 71 and a regulator 72 connected to the starter circuit 70, and a brownout comparator 73 connected to the starter circuit 70. The control IC 60 further includes a driver circuit 75 connected to the brownout comparator 73, and an oscillator 74, an output amplifier 76, a latch circuit 77 and a pulse width modulation (PWM) comparator 78 each connected to the driver circuit 75. A reference power supply 79 is connected to an inverting-input terminal of the brownout comparator 73.

The starter circuit 70 supplies the current to the power-supply capacitor 47 of the control IC 60 to charge the power-supply capacitor 47 upon startup of the switched-mode power-supply circuit. The low-voltage stop circuit 71 stops the starter circuit 70 when the voltage across the power-supply capacitor 47 is decreased to a predetermined level or lower. The brownout comparator 73 detects and monitors a level of an input voltage entered to a high-voltage input terminal 61 via the diode 52 so as to realize a brownout function to protect the high-breakdown-voltage JFET.

An output terminal of the output amplifier 76 is connected to a gate-output terminal 65 of the control IC 60. The driver circuit 75 controls the ON/OFF state of the MOS-transistor 48 via the output amplifier 76. The voltage across the secondary coil 37 of the transformer 34 is regulated by the ON/OFF operation of the MOS-transistor 48, and a predetermined DC voltage is fed from the output capacitor 39 on the secondary side via the pair of the output terminals 41a and 41b.

Figure 5:
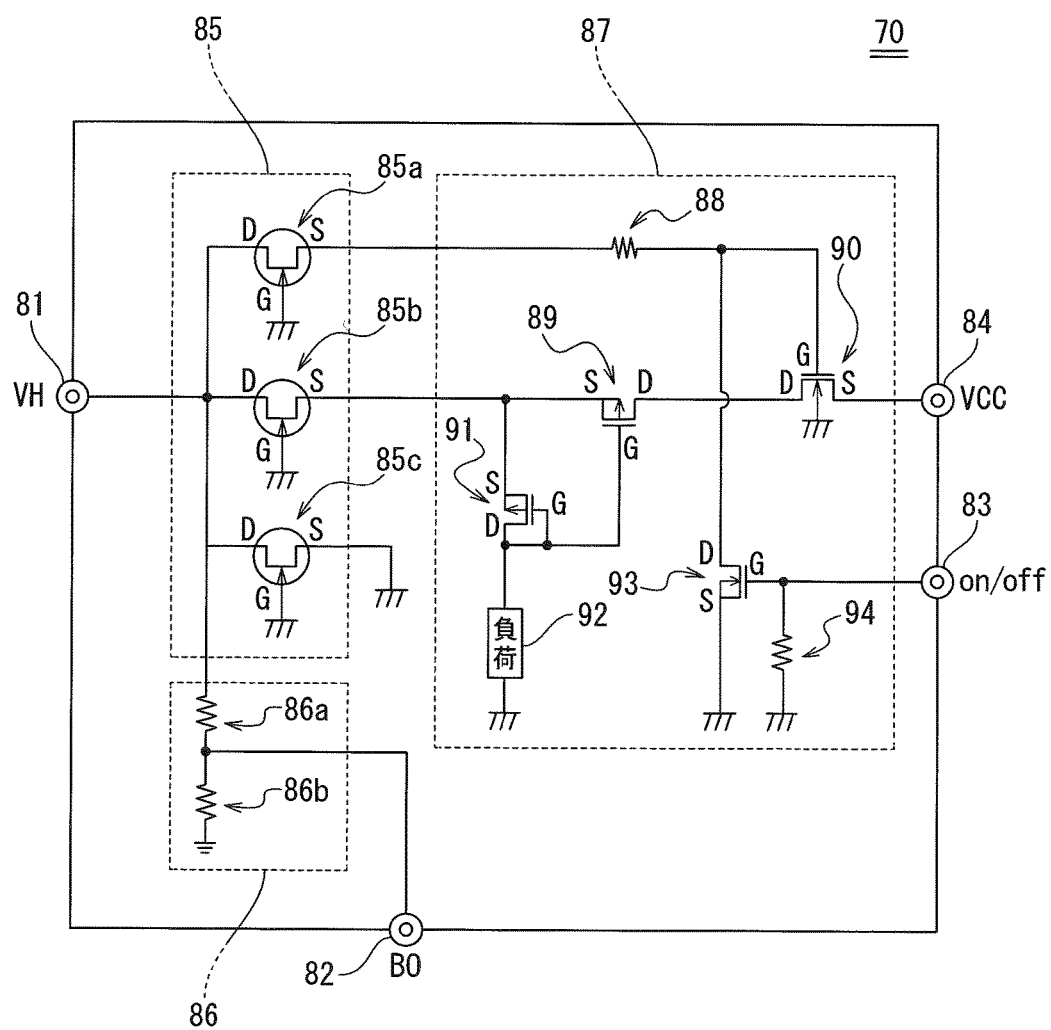
FIG. 5 is a circuit diagram schematically illustrating a starter circuit included in the switched-mode power-supply circuit using the semiconductor device according to the first embodiment.

As illustrated in FIG. 5, the starter circuit 70 includes a high-voltage input terminal 81, a brownout terminal 82, an ON/OFF signal input terminal 83, a power-supply terminal 84, and a ground terminal (not illustrated) connected to a ground terminal 66 of the control IC 60 illustrated in FIG. 4. The ground symbols indicated in FIG. 5 refer to a state in which the elements are connected to this ground terminal (not illustrated). The high-voltage input terminal 81 of the starter circuit 70 is connected to the high-voltage input terminal 61 of the control IC 60 in the switched-mode power-supply circuit illustrated in FIG. 4. The brownout terminal 82 of the starter circuit 70 is connected to the brownout comparator 73 of the control IC 60. The ON/OFF signal input terminal 83 of the starter circuit 70 is connected to the low-voltage stop circuit 71 of the control IC 60, so that an ON/OFF signal can be supplied via the low-voltage stop circuit 71. The power-supply terminal 84 of the starter circuit 70 is connected to the low-voltage stop circuit 71, the regulator 72, and the power-supply terminal 64 of the control IC 60.

The starter circuit 70 further includes the high-breakdown-voltage JFET 85, a starter auxiliary circuit 87 as an internal circuit, and a resistor circuit 86 including input-voltage detection-resistors. The high-breakdown-voltage JFET 85 includes a first JFET section 85a, a second JFET section 85b, and a third JFET section 85c. The respective drains of the first to third JFET sections 85a to 85c are connected to the high-voltage input terminal 81.

The high-breakdown-voltage JFET illustrated in FIG. 1 is provided with ten source regions and ten surge-current guiding-regions. In the ten source regions, continuous seven source regions including the source regions 7a and 7b are connected to the source wire 20a, and the other continuous three source regions including the source regions 7c are connected to the source wire 20b, for example. The seven source regions are defined as the first JFET section 85a, and the three source regions are defined as the second JFET section 85b. Since the source wiring is divided into two wires, the semiconductor device illustrated in FIG. 1 can simultaneously implement the first JFET section 85a and the second JFET section 85b. The ten surge-current guiding-regions are all connected to the ground wiring, and collectively defined as the third JFET section 85*c*.

The resistor circuit 86 includes a resistor pattern 86*a* and a resistor pattern 86*b* connected in series to detect the input voltage applied to the starter circuit 70. As illustrated in FIG. 5, the upper end of the resistor pattern 86*a* on the upper side of the resistor circuit 86 is connected to the high-voltage input terminal 81, and the lower end of the resistor pattern 86*b* on the lower side of the resistor circuit 86 is grounded. A voltage applied via the high-voltage input terminal 81 is divided by the resistor circuit 86, and then fed to the brownout terminal 82 connected to the middle node between the resistor pattern 86*a* and the resistor pattern 86*b*. The resistor circuit 86 corresponds to the resistor pattern 14 in the high-breakdown-voltage JFET illustrated in FIG. 1 to FIG. 3. Although not illustrated in FIG. 1 to FIG. 3, the wiring above the first interlayer insulating film 13 is electrically connected to the resistor pattern 14 via the wiring installed in the via-hole penetrating the first interlayer insulating film 13. The connected position between the resistor pattern 14 and the wiring is located at a position between the source-region side-edge of the resistor pattern 14 and the intermediate position between the drain-region side-edge and the source-region side-edge of the resistor pattern 14. The wiring is electrically connected to the brownout terminal 82.

The starter auxiliary circuit 87 includes a first pMOS-transistor 89, a first nMOS-transistor 90, a second pMOS-transistor 91, and a second nMOS-transistor 93. A resistor pattern 88 is connected between a gate of the first nMOS-transistor 90 and a source of the first JFET section 85*a* of the high-breakdown-voltage JFET 85, so that a current is supplied to the first nMOS-transistor 90 from the source of the first JFET section 85*a* via the resistor pattern 88. A source of the first nMOS-transistor 90 is connected to the power-supply terminal 84.

A source of the first pMOS-transistor 89 and a source of the second pMOS-transistor 91 are both connected to a source of the second JFET section 85*b* of the high-breakdown-voltage JFET 85. A drain of the first pMOS-transistor 89 is connected to a drain of the first nMOS-transistor 90. A gate of the first pMOS-transistor 89, a gate of the second pMOS-transistor 91, and a drain of the second pMOS-transistor 91 are connected together at a connected point, and this connected point is connected to one end of a load 92. The other end of the load 92 is grounded.

A gate of the second nMOS-transistor 93 is connected to the ON/OFF signal input terminal 83. One end of a resistor pattern 94 is connected between the gate of the second nMOS-transistor 93 and the ON/OFF signal input terminal 83, and the other end of the resistor pattern 94 is grounded. A drain of the second nMOS-transistor 93 is connected between the resistor pattern 88 and the first nMOS-transistor 90, and a source of the second nMOS-transistor 93 is grounded.

When a high voltage is supplied via the high-voltage input terminal 81 of the starter circuit 70, the input high voltage is applied to the respective drains of the first JFET section 85*a* and the second JFET section 85*b* of the high-breakdown-voltage JFET 85. When the high voltage is applied, a current flows through the source of the high-breakdown-voltage JFET 85 toward the starter auxiliary circuit 87. The current then flows toward the power-supply terminal 84 via the first nMOS-transistor 90 of the starter auxiliary circuit 87. The current flowing through the power-supply terminal 84 further flows toward the power-supply capacitor 47 via the power-supply terminal 64 of the control IC 60 in the switched-mode power-supply circuit illustrated in FIG. 4. The power-supply capacitor 47 to which the current is supplied serves as a power supply of the control IC 60, and increases source potential of the high-breakdown-voltage JFET 85 electrically connected to the power-supply capacitor 47.

The switched-mode power-supply circuit is started up in accordance with a sequence of operations of the starter circuit 70 including the high-breakdown-voltage JFET 85. The structures and functions of other elements included in the switched-mode power-supply circuit and the starter circuit are equivalent to the structures and functions of the corresponding elements in the circuit disclosed in FIG. 8 and FIG. 9 in JP 2015-135844A, for example.

Next, the operation of the semiconductor device according to the first embodiment will be described in more detail below, while focusing on two source regions 7*a* and 7*b* and one surge-current guiding-region 5*a* interposed between the two source regions 7*a* and 7*b* illustrated in FIG. 1. FIG. 6 to FIG. 14 do not indicate the gate contact region 10 for clearly illustrating the shape of a depletion layer J.

In a normal operation of the high-breakdown-voltage JFET, an input voltage is applied to the drain region located in the center of the high-breakdown-voltage JFET via the input pad, and a current flows through the source regions 7*a* and 7*b* from the drain region. The current is supplied to the power-supply capacitor 47 via the starter auxiliary circuit 87 connected to the source regions 7*a* and 7*b*, so as to increase the potential of the power-supply terminal 64. Since the potential of the source regions 7*a* and 7*b* increases as the potential of the power-supply terminal 64 increases, reverse bias between the source regions 7*a* and 7*b* and the p-type gate region 9 increases.

The reverse bias spreads the depletion layer J from a p-n junction created between the n-type region including the drift layer 4 and the source regions 7*a* and 7*b* and the p-type region of the gate region 9. Since the surge-current guiding-region 5*a* is grounded via the ground terminal 66, an increase in potential which occurs in the source regions 7*a* and 7*b* does not occur in the surge-current guiding-region 5*a*. In the semiconductor device according to the first embodiment, the width w2 of the entrances of the U-shapes of the second concave pattern 9*b* in which the surge-current guiding-region 5*a* is provided is narrower than the width w1 of the entrances of the U-shapes of the first concave patterns 9*a*1 and 9*a*2 in which the source regions 7*a* and 7*b* are provided.

Therefore, when the depletion layer J spreads from the entrances of the U-shapes of the first concave patterns 9*a*1 and 9*a*2 as illustrated in FIG. 6, the depletion layer J spreading on both sides of the second concave pattern 9*b* joins at the entrances of the U-shapes of the second concave pattern 9*b* interposed between the two first concave patterns 9*a*1 and 9*a*2. As a result, the pinch-off occurs in the drift layer 4 at the entrances of the U-shapes of the second concave pattern 9*b* even though the surge-current guiding-region 5*a* and the gate region 9 are both ground potential.

Figure 7:
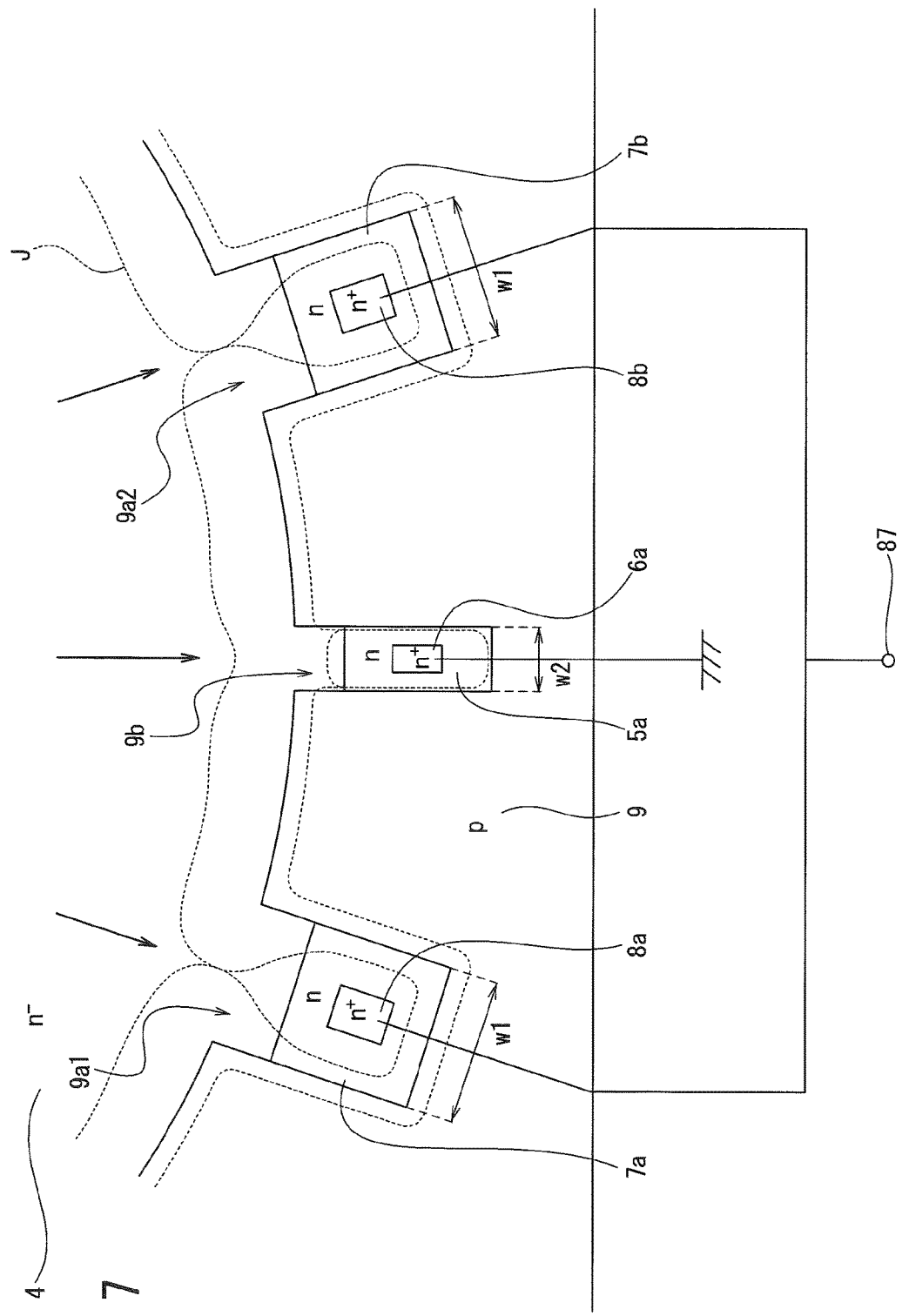
FIG. 7 is a schematic plan view illustrating a state in which the current is cut off in both of the surge-current guiding-region and a source region during the normal operation after the state illustrated in FIG. 6 in the semiconductor device according to the first embodiment.

When the power-supply capacitor 47 is charged and the potential of the power-supply terminal 64 in the switched-mode power-supply circuit reaches a predetermined level, the two tops of the facing depletion layers J also mutually touch at the entrances of the U-shapes of the first concave patterns 9*a*1 and 9*a*2 to generate the pinch-off in the drift layer 4, as illustrated in FIG. 7. As a result, a current does not flow through the semiconductor device serving as a starter element.

The pinch-off at the entrances of the U-shapes of the second concave pattern 9b preferably occurs earlier than at the entrances of the U-shapes of the first concave patterns 9a1 and 9a2. A current path from the drain region 2 toward the surge-current guiding-region 5a is blocked when a current path from the drain region 2 toward the source regions 7a and 7b is blocked. The current flowing through the surge-current guiding-region 5a to the ground during the normal operation of the control IC 60 is thus cut off.

Figure 8:
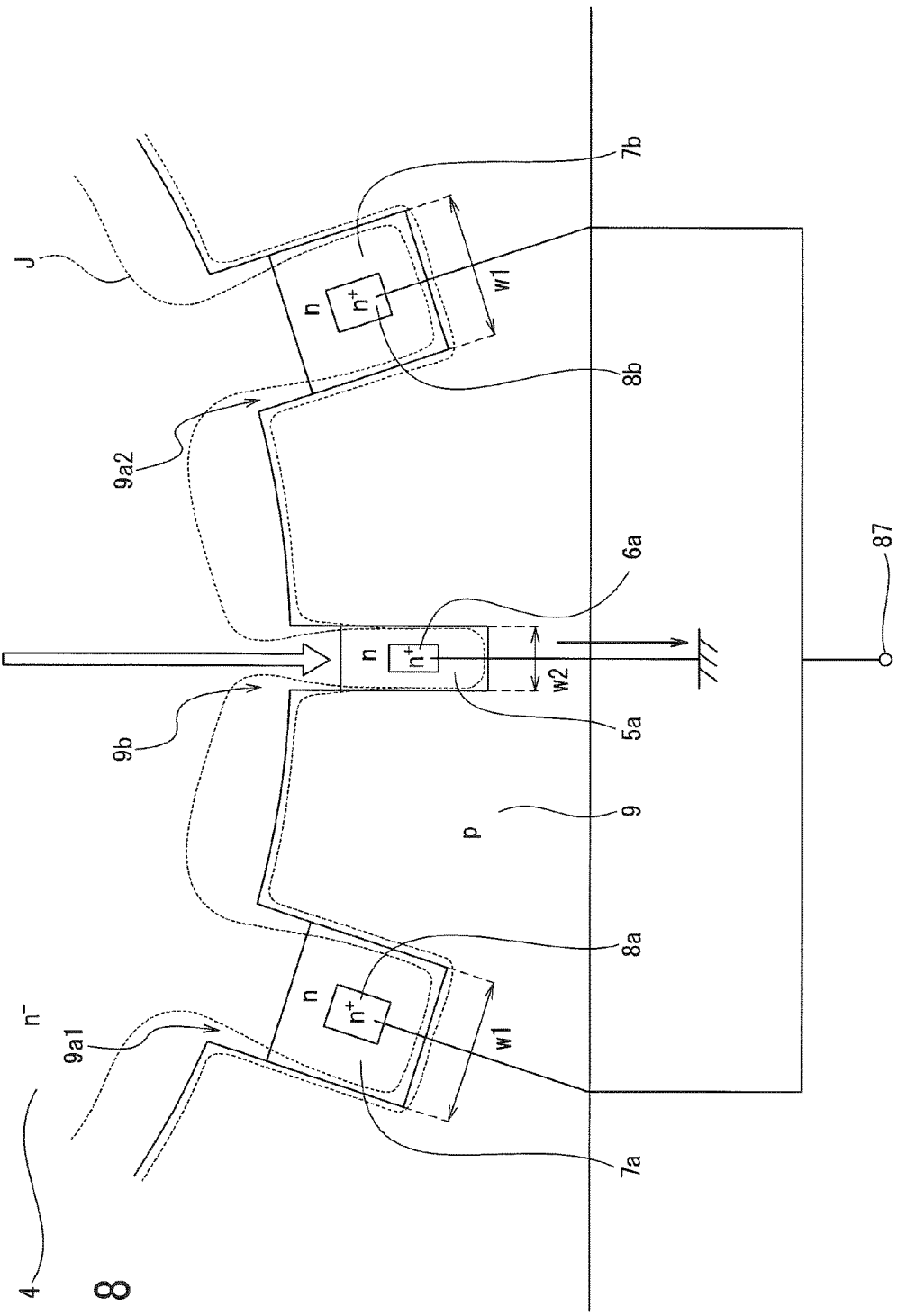
FIG. 8 is a schematic plan view illustrating an action in which the surge current flows through the semiconductor device according to the first embodiment.

As illustrated in FIG. 8, when a steep voltage such as the ESD surge is applied to the semiconductor device, a significantly large current flows from the drain region to the outside via the input pad located in the center. The outer shapes of the depletion layers J do not spread regularly in the same manner as in the case of the normal operation at either the first concave patterns 9a1 and 9a2 or the second concave pattern 9b at the point of flow of the large current because of the application of the steep voltage. Thus, pinch-off does not occur, or the current paths are not blocked.

In the semiconductor device according to the first embodiment, the surge-current guiding-region 5a is grounded via the ground terminal 66 as described above. Therefore, the large current caused by the ESD surge preferentially flows from the drain region to the surge-current guiding-region 5a via the drift layer 4 to be released to the outside. Accordingly, an excessive increase in potential in the starter auxiliary circuit 87 and the switched-mode power-supply circuit can be prevented, and thus the semiconductor device can be protected reliably.

COMPARATIVE EXAMPLE

Figure 9:
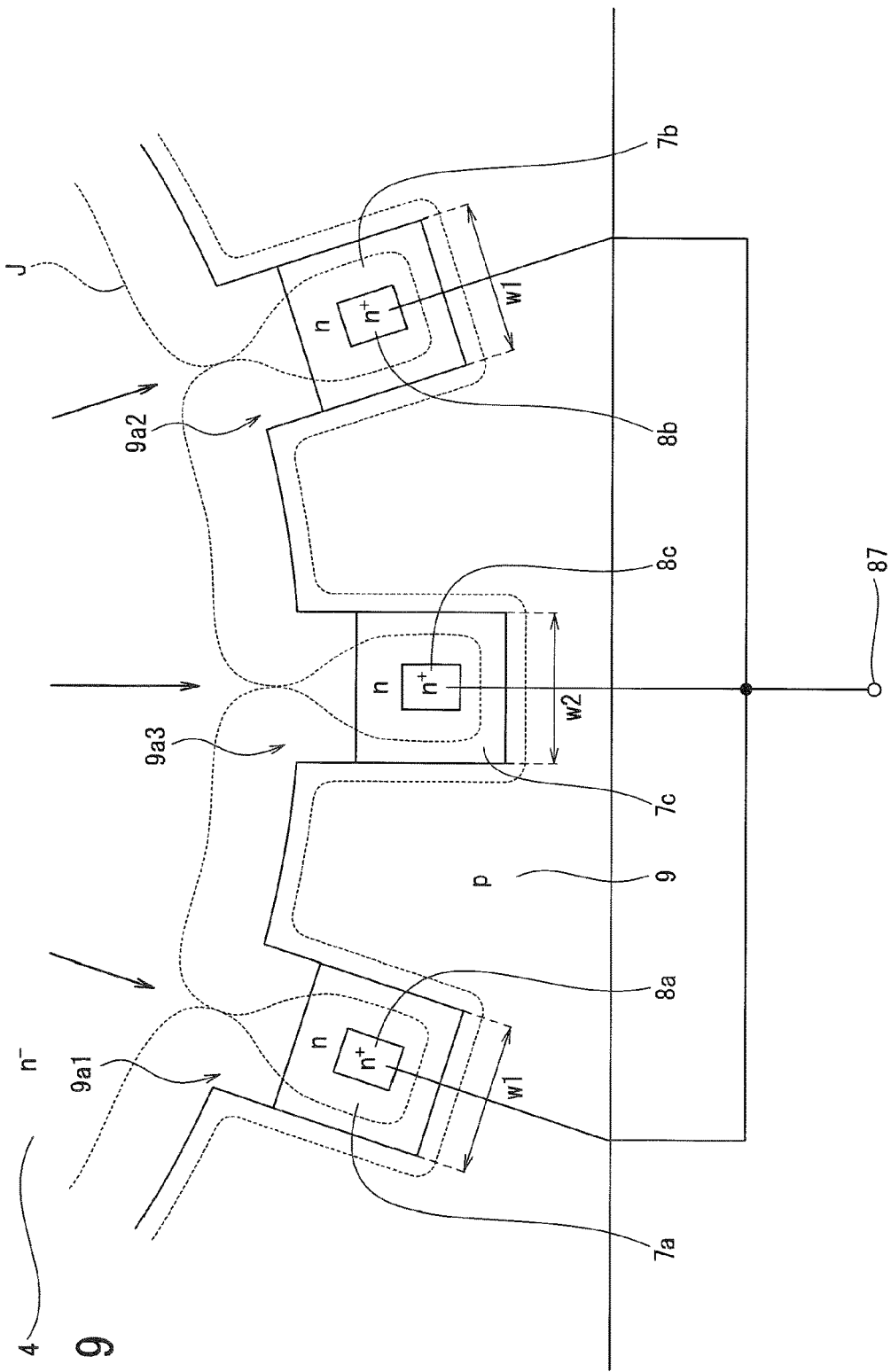
FIG. 9 is a schematic plan view illustrating a state in which the current is cut off during normal operation in a semiconductor device according to a comparative example.

As illustrated in FIG. 9, a high-breakdown-voltage JFET has been prepared as a semiconductor device according to a comparative example in which source regions 7a, 7b, and 7c are disposed in first concave patterns 9a1, 9a2, and 9a3 having the same dimensions without the second concave pattern and the surge-current guiding-region provided. As in the case described above, when the starter circuit starts operation, and the potential of the source regions 7a, 7b, and 7c is increased to a predetermined level in the semiconductor device according to the comparative example, pairs of the facing depletion layers J mutually touch at the entrances of the U-shapes of the first concave patterns 9a1, 9a2, and 9a3 to result in the pinch-off in the drift layer 4. As a result, a current flowing from the drain region 2 toward the source regions 7a, 7b, and 7c is cut off.

Figure 10:
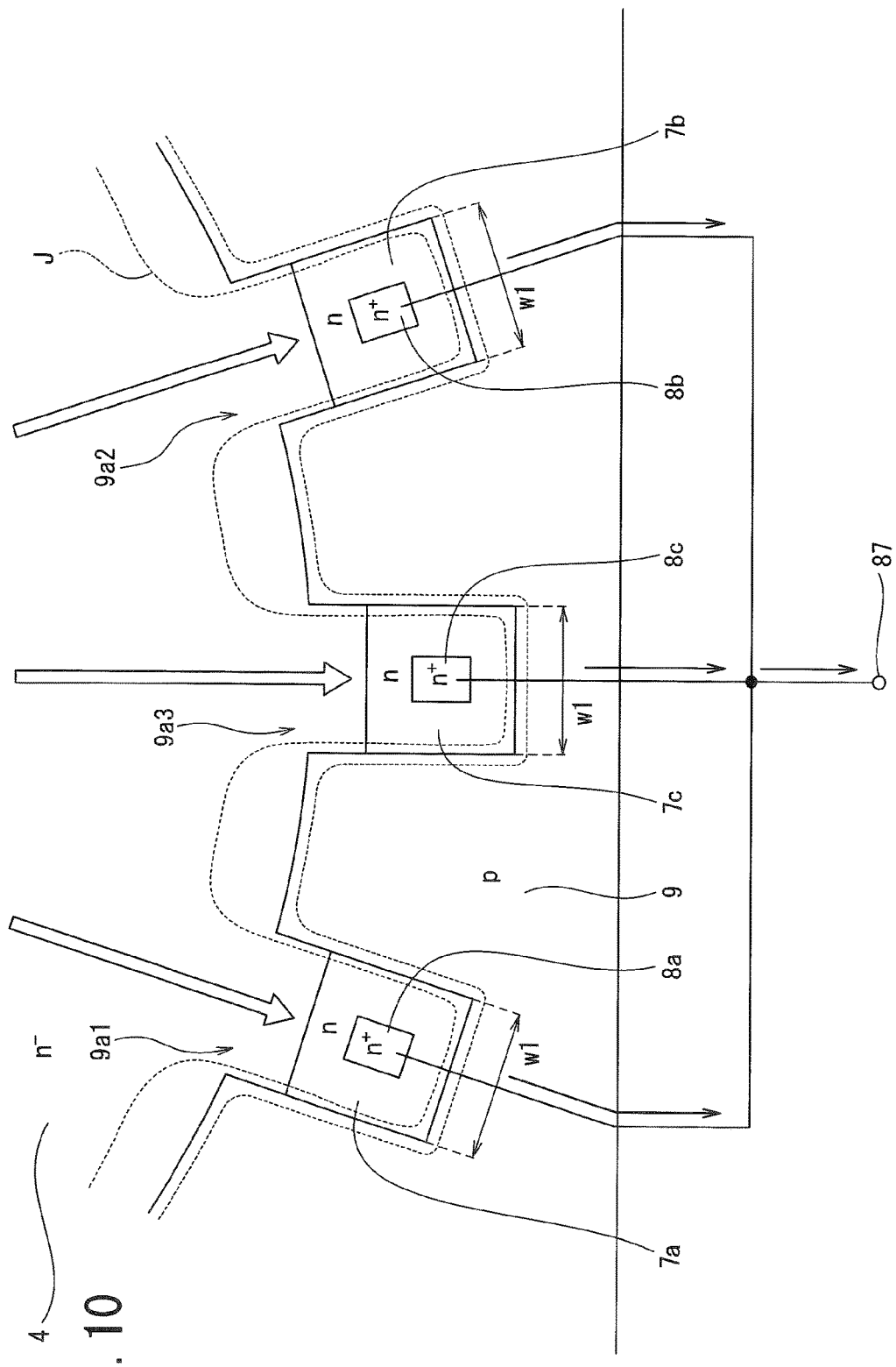
FIG. 10 is a schematic plan view illustrating an action in which the surge current flows through the semiconductor device according to the comparative example.

As illustrated in FIG. 10, when a steep and large voltage such as the ESD surge is applied to the input pad 19, a large current is supplied from the drain region 2 to all of the source regions 7a, 7b, and 7c via the drift layer 4. When the large current supplied from the drain region 2 exceeds the SWC of the high-breakdown-voltage JFET 85, the semiconductor device is broken. The starter auxiliary circuit 87 and other circuit elements connected on the downstream side of the high-breakdown-voltage JFET 85 are also broken when the large current supplied from the drain region 2 exceeds the SWC.

Since the semiconductor device according to the first embodiment includes the surge-current guiding-region 5a connected to the ground terminal 66 and interposed between the source regions 7a and 7b connected to the power-supply terminal 64, a large current is immediately released to the outside so as to protect the semiconductor device when the ESD surge is supplied. Accordingly, in the first embodiment, it is possible to achieve a semiconductor device capable of minimizing device size and enhancing SWC.

Further, in the semiconductor device according to the first embodiment, the width w2 of the entrances of the U-shapes of the second concave pattern 9b in which the surge-current guiding-region 5a is provided is provided to be narrower than the width w1 of the entrances of the U-shapes of the first concave patterns 9a1 and 9a2 in which the source regions 7a and 7b are provided. Therefore, when the reverse bias applied to the p-n junction created between the gate region 9 and the source regions 7a and 7b increases during the normal operation of the high-breakdown-voltage JFET 85, pairs of the depletion layers J spreading from the first concave patterns 9a1 and 9a2 mutually touch at the entrances of the U-shapes on the surge-current guiding-region 5a side, so that the current flowing through the surge-current guiding-region 5a is cut off, even when reverse bias is not applied between the surge-current guiding-region 5a and the gate region 9. Accordingly, the amount of current consumed wastefully can be minimized.

(First Modification)

Figure 11:
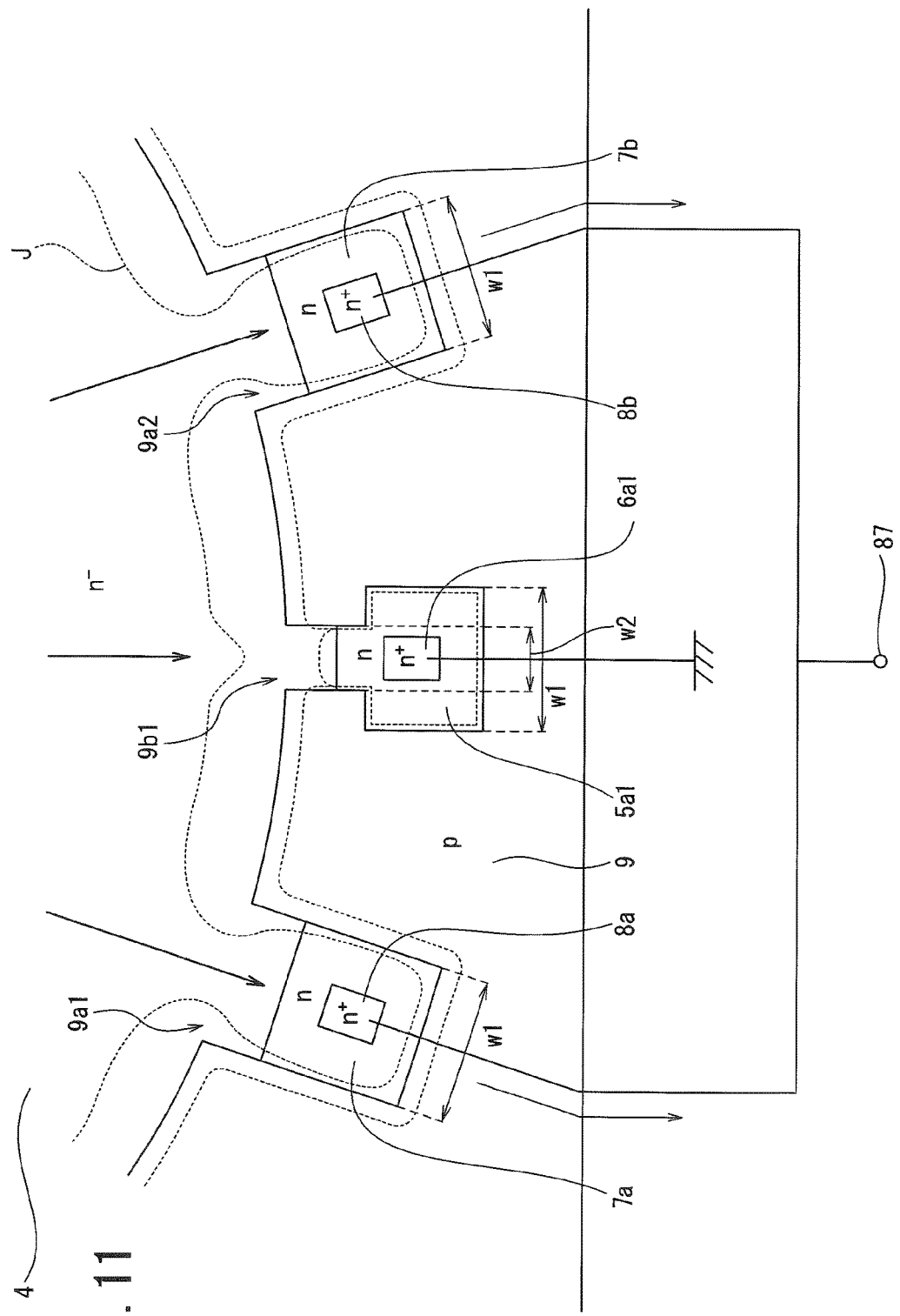
FIG. 11 is a schematic plan view illustrating a state in which the current is cut off first in a surge-current guiding-region during normal operation in a modification (a first modification) of the semiconductor device according to the first embodiment.

In the semiconductor device illustrated in FIG. 6, the second concave pattern 9b in which the surge-current guiding-region 5a is provided has the U-shaped bottom having substantially the same width as the width w2 at the entrances of the U-shapes. Alternatively, a semiconductor device according to a modification of the first embodiment (first modification) may include a second concave pattern 9b1 having a width w1 at a U-shaped bottom which is wider than the width w2 at the necks of the U-shapes, as illustrated in FIG. 11. In the semiconductor device according to the first modification, the second concave pattern 9b1 has an inverted wide T-shape or an urn-shape in a planar pattern, while the width w1 of the lateral bar of the T-shape or the width w1 measured at the bottom of the urn-shape is the same width as the width w1 at the entrances of the U-shapes of the first concave patterns 9a1 and 9a2.

A surge-current guiding-region 5a1 having the inverted T-shape or the urn-shape is provided in the second concave pattern 9b1. A surge-current guiding contact-region 6a1 is provided at the top surface and in the surge-current guiding-region 5a1 and connected to the ground potential. The other elements in the semiconductor device according to the first modification are the same as in the semiconductor device according to the first embodiment as described with reference to FIG. 1 to FIG. 10, and duplicate description will be omitted.

The semiconductor device according to the first modification includes the surge-current guiding-region 5a1 connected to the ground potential in the same manner as the semiconductor device illustrated in FIG. 6. Therefore, it is possible to achieve a semiconductor device capable of minimizing device size and enhancing SWC. Further, since the width w2 at the entrances of the U-shapes of the second concave pattern 9b1 is provided to be narrower than the width w2 at the entrances of the U-shapes of the first concave patterns 9a1 and 9a2, pinch-off may occur at the entrances of the U-shapes on the surge-current guiding-region 5a1 side earlier than at the entrances of the U-shapes on the source region side. When the entrances of the U-shapes of the first concave patterns 9a1 and 9a2 are pinched off, current flowing through the surge-current guiding-region 5a1 also can be cut off. Thus, it is possible to suppress a wasteful consumption of current flowing to the ground via the surge-current guiding-region 5a1.

Furthermore, in the semiconductor device according to the first modification, the width w1 of the surge-current guiding-region 5a1 may be wider than the width w2 at the entrances of the U-shapes of the second concave pattern 9b1, and the shape of the surge-current guiding-region 5a1 can be appropriately changed. Thus, the degree of freedom for designing the layout in manufacturing the semiconductor device can improve. Further, the area of the top surface of the surge-current guiding-region 5a1 can be increased as compared with the surge-current guiding-region 5a of the semiconductor device illustrated in FIG. 6. Accordingly, the surge-current guiding contact-region 6a1 can be made to the same shape of the source contact region 8a or 8b. Also, the via-hole opening to the surge-current guiding contact-region 6a1 can be made to the same shape of the via-holes opening to the source contact region 8a or 8b.

<Second Embodiment>

A semiconductor device according to a second embodiment, is a high-breakdown-voltage JFET 85 which is used as a starter element for a starter circuit included in a switched-mode power-supply circuit, as is the case with the semiconductor device according to the first embodiment. In the semiconductor device according to the first embodiment, the width at the entrances of the U-shapes of the second concave pattern 9b provided in the gate region 9 is set to be narrower than the width at the entrances of the U-shapes of the first concave patterns 9a1 and 9a2 so as to pinch off at the entrances of the U-shapes on the surge-current guiding-region 5a side earlier than at the entrances of the U-shapes on the source region side. The semiconductor device according to the second embodiment differs from the semiconductor device according to the first embodiment in providing "a pinch-off assisting region" around the entrances of the U-shapes of a second concave pattern 9c without change in width at the entrances of the U-shapes of the second concave pattern 9c provided in the gate region 9, so as to assist and promote the occurrence of pinch off at the entrances of the U-shapes of the second concave pattern 9c earlier than at the entrances of the U-shapes of the first concave patterns 9a1 and 9a2.

Although not illustrated in the drawings, the semiconductor device according to the second embodiment includes the p-type semiconductor substrate 1, the n-type drain region 2 disposed at the upper portion of the semiconductor substrate 1, and the n⁻-type drift layer 4 disposed in contact with the drain region 2 at the top surface and in the semiconductor substrate 1, as is the case with the first embodiment. The gate region including the plural first concave patterns 9a1 and 9a2 and plural second concave patterns 9c is disposed at the upper portion of the semiconductor substrate 1 on the opposite side of the drain region 2. The first concave patterns 9a1 and 9a2 and the second concave patterns 9c are recessed to the outer side and extend in the thickness direction of the semiconductor device in a manner such that the entrances of the U-shapes of the respective concave patterns are located at equal distances from the drain region 2.

Figure 12:
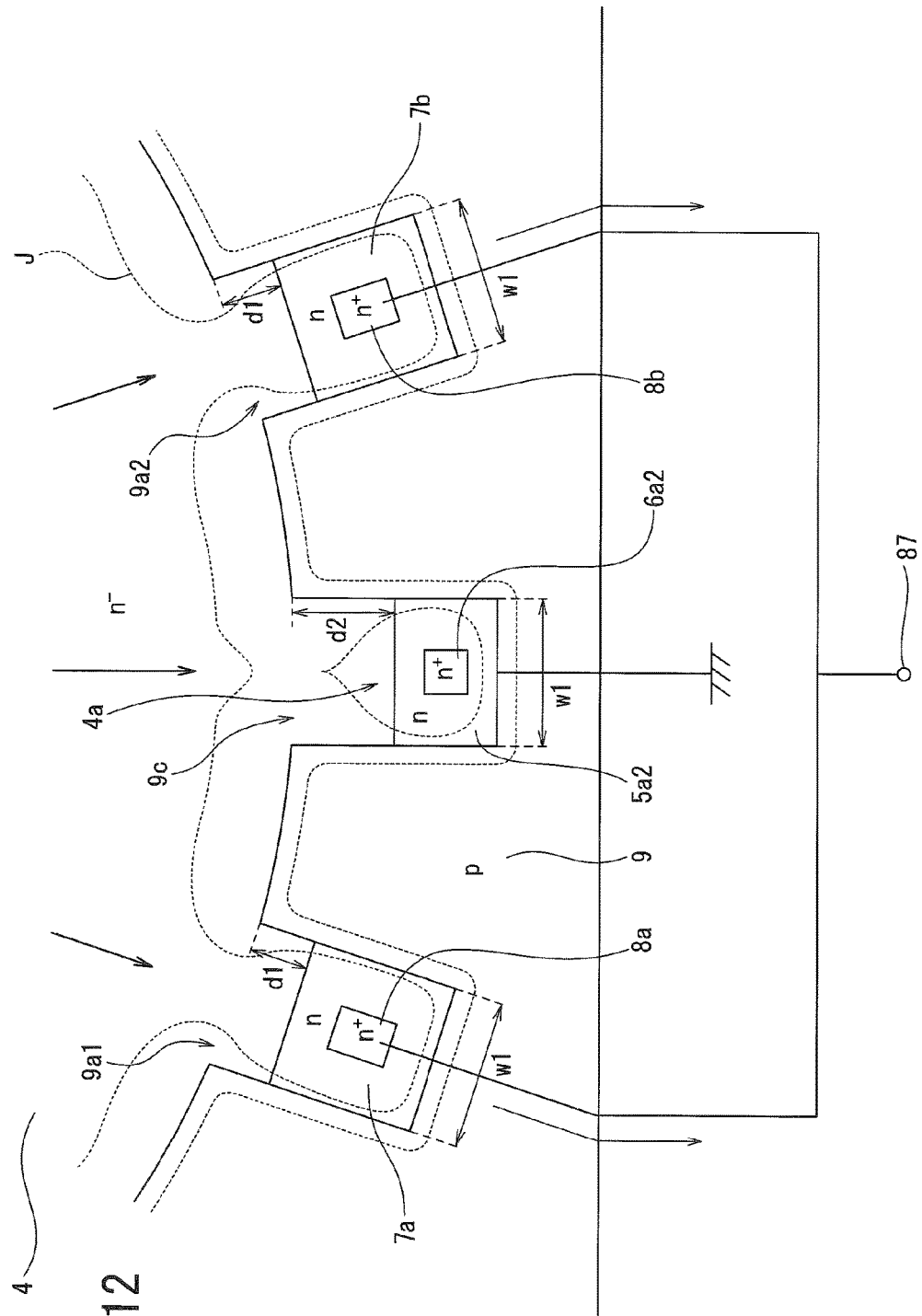
FIG. 12 is a schematic plan view illustrating a state in which a current is cut off first in a surge-current guiding-region during normal operation in a semiconductor device according to a second embodiment.

As illustrated in FIG. 12, the n-type source regions 7a and 7b contact with the drift layer 4 and the gate region 9 in the inner side of the first concave patterns 9a1 and 9a2. An n-type surge-current guiding-region 5a2 is disposed in contact with the drift layer 4 and the gate region 9 in the inner side of the second concave pattern 9c. A surge-current guiding contact-region 6a2 is provided at the top surface and in the surge-current guiding-region 5a2, and the surge-current guiding-region 5a2 is connected to the ground potential via the surge-current guiding contact-region 6a2.

The source regions 7a and 7b are separated by a distance d1 from the entrances of the U-shapes of the first concave patterns 9a1 and 9a2. The surge-current guiding-region 5a2 is separated by a distance d2, which is longer than the distance d1 on the source region side, from the entrances of the U-shapes of the second concave pattern 9c. The area of the drift layer 4 between the entrances of the U-shapes of the second concave pattern 9c and the surge-current guiding-region 5a2 is larger than the respective areas of the drift layer 4 between the entrances of the U-shapes of the first concave patterns 9a1 and 9a2 and the source regions 7a and 7b. The area of the drift layer 4 between the entrances of the U-shapes of the second concave pattern 9c and the surge-current guiding-region 5a2 is provided as a first n-type region 4a, and thus the n-type region 4a has lower n-type impurity concentration than the source regions 7a and 7b.

By the first n-type region 4a, an n-type impurity concentration between the entrances of the U-shapes of the second concave pattern 9c and the surge-current guiding-region 5a2 is adjusted to be lower than an n-type impurity concentration between the entrances of the U-shapes of the first concave patterns 9a1, 9a2 and the source regions 7a, 7b. Therefore, upon the reverse bias, the depletion layers J joins at the entrances of the U-shapes of the second concave pattern 9c before the depletion layers J joins at the entrances of the U-shapes of the first concave patterns 9a1 and 9a2. The first n-type region 4a corresponds to "the pinch-off assisting region" provided around the second concave pattern 9c according to the present invention. The other elements in the semiconductor device according to the second embodiment are the same as in the semiconductor device according to the first embodiment as described with reference to FIG. 1 to FIG. 11, and duplicate description will be omitted.

The semiconductor device according to the second embodiment includes the grounded surge-current guiding-region 5a2 in the second concave pattern 9c, so as to release a large current caused by the ESD surge to the outside, as in the case of the semiconductor device according to the first embodiment. Accordingly, in the second embodiment, it is possible to achieve a semiconductor device capable of minimizing device size and enhancing SWC.

Further, according to the semiconductor device of the second embodiment, the first n-type region 4a adjusts the n-type impurity concentration in the region around the entrances of the U-shapes of the second concave pattern 9c to a lower level than the n-type impurity concentration in the regions around the first concave patterns. Thus, pinch-off may occur at the entrances of the U-shapes on the surge-current guiding-region 5a2 side earlier than at the entrances of the U-shapes on the source region side. Accordingly, when the entrances of the U-shapes of the first concave patterns 9a1 and 9a2 are pinched off, a wasteful consumption of current flowing to the ground via the surge-current guiding-region 5a2 can be minimized.

Furthermore, in the semiconductor device according to the second embodiment, since all of the concave patterns in the gate region can be fabricated with the same pattern, it is possible to facilitate the manufacture process. The other effectiveness in the semiconductor device according to the second embodiment are the same as in the semiconductor device according to the first embodiment.

(Second Modification)

Figure 13:
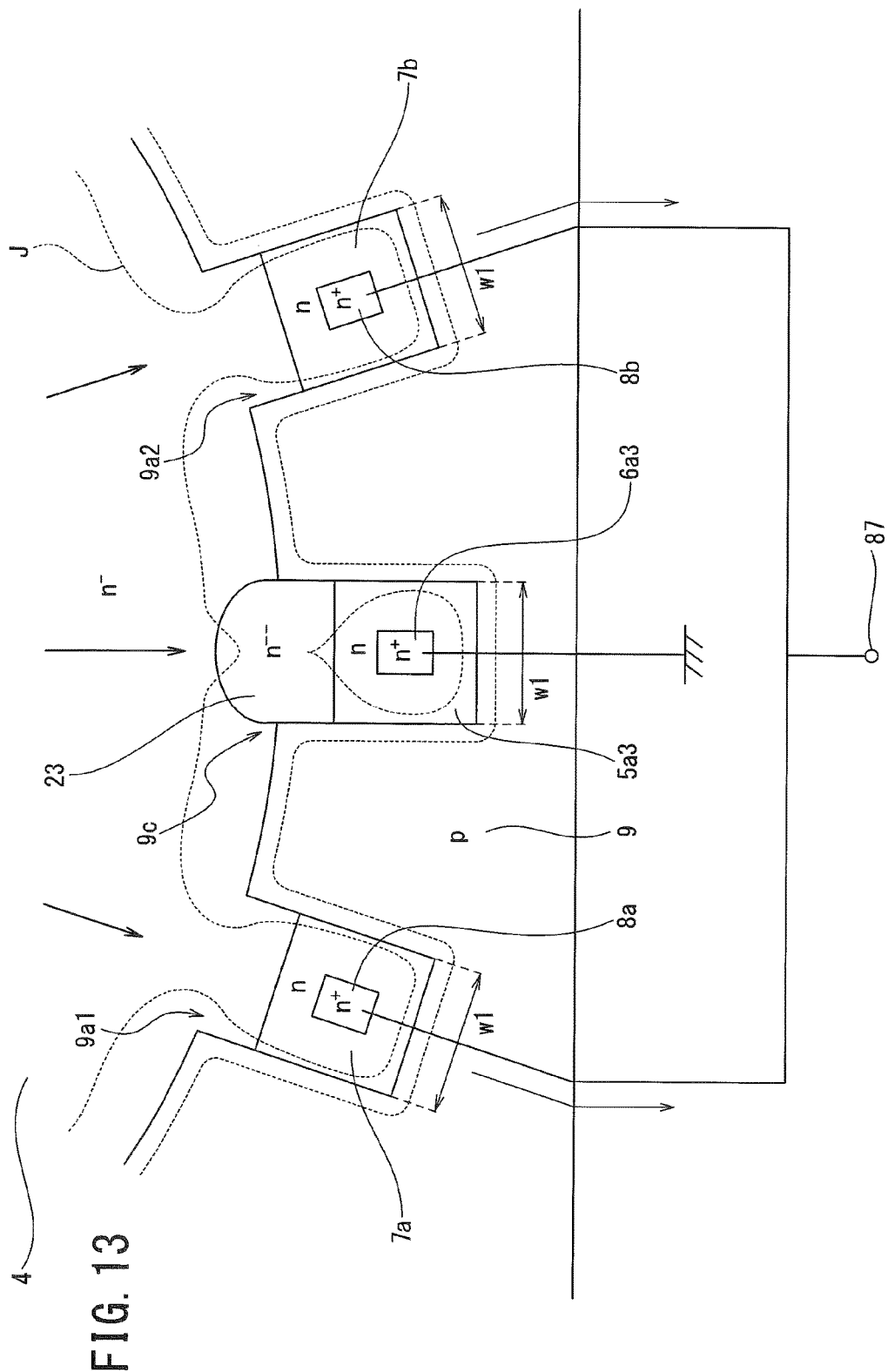
FIG. 13 is a schematic plan view illustrating a state in which a current is cut off first in a surge-current guiding-region during normal operation in a modification (a second modification) of the semiconductor device according to the second embodiment.

A semiconductor device according to a modification of the second embodiment (second modification) may include a second n-type region 23, as a pinch-off assisting region, having a lower impurity concentration of n⁻ than the n⁻-type drift layer 4 and an n-type surge-current guiding-region 5a3, as illustrated in FIG. 13.

The surge-current guiding-region 5a3 is disposed in contact with the drift layer 4 and the gate region 9 in the inner side of the second concave pattern 9c. A n⁺-type surge-current guiding contact-region 6a3 is provided at the top surface and in the surge-current guiding-region 5a3, and the surge-current guiding-region 5a3 is connected to the ground potential via the surge-current guiding contact-region 6a3.

The second n-type region 23 is provided between the n⁻-type drift layer 4 and the n-type surge-current guiding-region 5a3. The second n-type region 23 is disposed to include a pinch-off point at which the depletion layers J joins by extending from the two first concave patterns 9a1 and 9a2 on both sides of the second concave pattern 9c. The second n-type region 23 adjusts a concentration of n-type impurities around the entrances of the U-shapes of the second concave pattern 9c to be lower than the impurity concentration around the entrances of the U-shapes of the first concave patterns 9a1 and 9a2. Therefore, upon the reverse bias, the pinch-off may occur at the entrances of the U-shapes of the second concave pattern 9c earlier than at the entrances of the U-shapes of the first concave patterns 9a1 and 9a2. The second n-type region 23 corresponds to "the pinch-off assisting region" provided around the second concave pattern 9c according to the present invention. The other elements in the semiconductor device according to the second modification are the same as in the semiconductor device as described with reference to FIG. 1 to FIG. 12, and duplicate description will be omitted.

The semiconductor device according to the second modification includes the grounded surge-current guiding-region 5a3 in the second concave pattern 9c, so as to release a large current caused by the ESD surge to the outside, as in the case of the semiconductor device according to the first embodiment. Accordingly, in the second modification, it is possible to achieve a semiconductor device capable of minimizing device size and enhancing SWC.

According to the semiconductor device of the second modification, the second n-type region 23 adjusts the n-type impurity concentration in the n-type region around the entrances of the U-shapes of the second concave pattern 9c to a lower level than the impurity concentration around the entrances of the U-shapes of the first concave patterns 9a1 and 9a2. Thus, the pinch-off may occur at the entrances of the U-shapes on the surge-current guiding-region 5a3 side earlier than at the entrances of the U-shapes on the source region side. Accordingly, when the pinch-off occurs at the entrances of the U-shapes of the first concave patterns 9a1 and 9a2, an amount of a wasteful consumption of current flowing to the ground via the surge-current guiding-region 5a3 can be minimized. The other effectiveness in the semiconductor device according to the second modification are the same as in the semiconductor device as described with reference to FIG. 1 to FIG. 12.

The second n-type region 23 having lower impurity concentration may be formed at the second concave pattern 9c such that the area between the entrances of the U-shapes of the second concave pattern 9c and the surge-current guiding-region 5a3 is larger than the area of the drift layer 4 inside the respective first concave patterns 9a1 and 9a2, as in the case illustrated in FIG. 12. Alternatively, the second n-type region 23 may be provided such that the distance d2 between the entrances of the U-shapes of the second concave pattern 9c and the surge-current guiding-region 5a3 is longer than the distance d1 between the respective entrances of the U-shapes of the first concave patterns 9a1 and 9a2 and the respective source regions 7a and 7b, as in the case illustrated in FIG. 12. In such a case, the area of the second n-type region 23 between the entrances of the U-shapes of the second concave pattern 9c and the surge-current guiding-region 5a3 is not necessarily larger than the area of the drift layer 4 inside the respective first concave patterns 9a1 and 9a2. By providing the longer distance d2 and the lower impurity concentration of the second n-type region 23, the pinch-off may occur at the entrances of the U-shapes of the second concave pattern 9c earlier than at the entrances of the U-shapes of the first concave patterns 9a1 and 9a2 regardless of the size of the areas.

(Third Modification)

Figure 14:
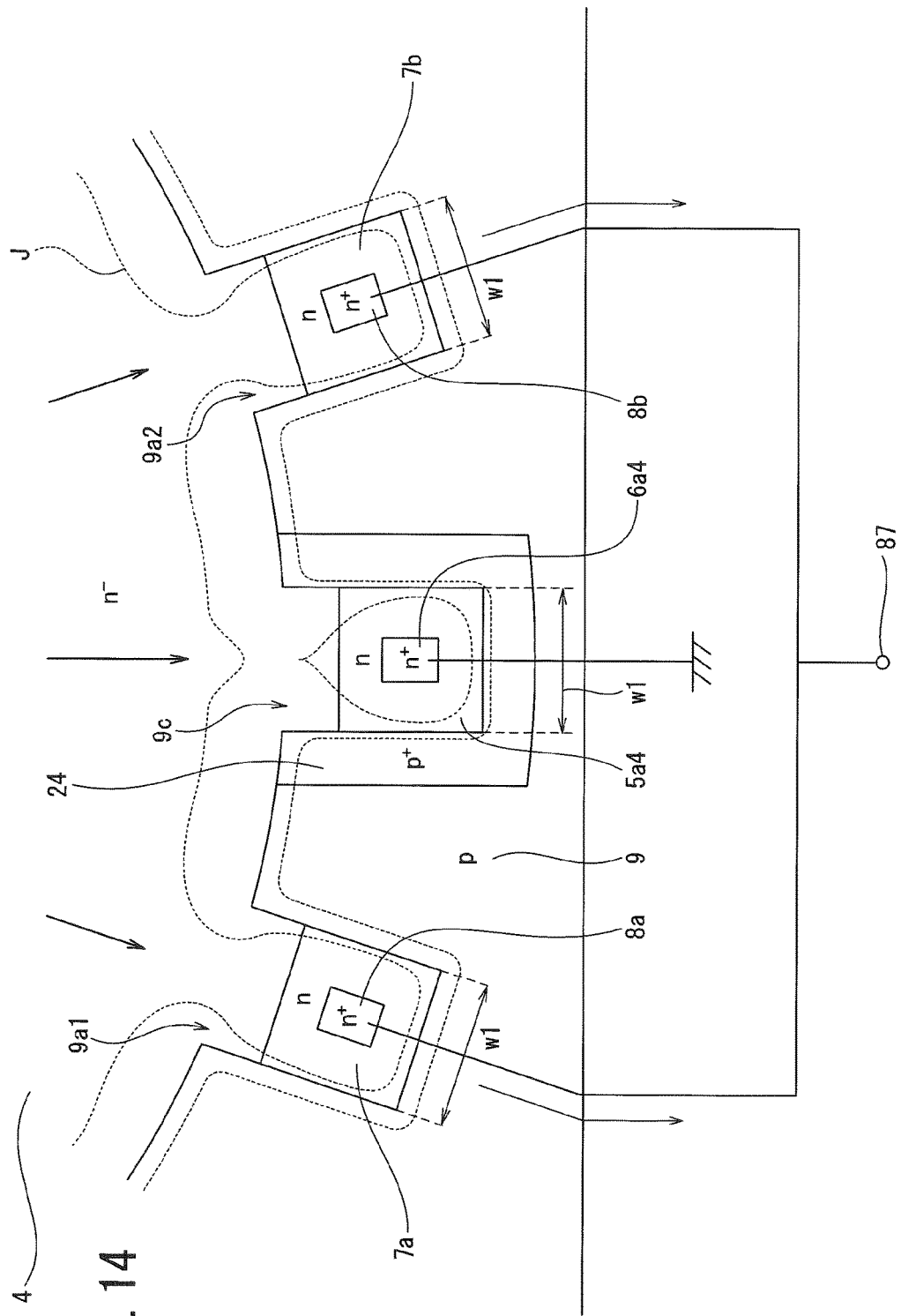
FIG. 14 is a schematic plan view illustrating a state in which a current is cut off first in a surge-current guiding-region during normal operation in a modification (a third modification) of the semiconductor device according to the second embodiment.

A semiconductor device according to another modification of the second embodiment (third modification) may include a first p-type region 24, as a pinch-off assisting region, having a higher impurity concentration of p⁺ than the gate region 9, as illustrated in FIG. 14. An n-type surge-current guiding-region 5a4 is disposed in contact with the drift layer 4 and the gate region 9 in the inner side of the second concave pattern 9c. A surge-current guiding contact-region 6a4 is provided at the top surface and in the surge-current guiding-region 5a4, and the surge-current guiding-region 5a4 is connected to the ground potential via the surge-current guiding contact-region 6a4.

The first p-type region 24 is provided between the surge-current guiding-region 5a4 and the gate region 9 to surround the surge-current guiding-region 5a4. The first p-type region 24 has a U-shape in a planar pattern. The first p-type region 24 adjusts a p-type impurity concentration around the entrances of the U-shapes of the second concave pattern 9c to be higher than the p-type impurity concentration around the entrances of the U-shapes of the first concave patterns 9a1 and 9a2. Therefore, upon the reverse bias, the depletion layers J spreads from the first concave patterns 9a1 and 9a2 to a larger area including the entrances of the U-shapes and the inside of the second concave pattern 9c. The pinch-off thus occurs at the entrances of the U-shapes of the second concave pattern 9c earlier than at the entrances of the U-shapes of the first concave patterns 9a1 and 9a2. The first p-type region 24 corresponds to "the pinch-off assisting region" provided around the second concave pattern 9c according to the present invention. The other elements in the semiconductor device according to the third modification are the same as in the semiconductor device as described with reference to FIG. 1 to FIG. 13, and duplicate description will be omitted.

The semiconductor device according to the third modification includes the grounded surge-current guiding-region 5a4 in the second concave pattern 9c, so as to release a large current caused by the ESD surge to the outside, as in the case of the semiconductor device according to the first embodiment. Accordingly, in the third modification, it is possible to achieve a semiconductor device capable of minimizing device size and enhancing SWC.

Further, in the semiconductor device according to the third modification, the first p-type region 24 adjusts the p-type impurity concentration in the p-type region around the second concave pattern 9c to a higher level than the p-type impurity concentration around the first concave patterns 9a1 and 9a2, so as to assist and promote the occurrence of pinch off at the entrances of the U-shapes of the second concave pattern 9c on the surge-current guiding-region 5a4 side earlier than at the entrances of the U-shapes of the first concave patterns 9a1 and 9a2 on the source region side. A current flowing through the surge-current guiding-region 5a4 thus can be cut off when the pinch-off occurs at the entrances of the U-shapes of the first concave patterns 9a1 and 9a2, so that a wasteful consumption of current flowing to the ground via the surge-current guiding-region 5a4 can be minimized. The other effects in the semiconductor device according to the third modification are the same as in the semiconductor device as described with reference to FIG. 1 to FIG. 13.

(Fourth Modification)

Figure 15:
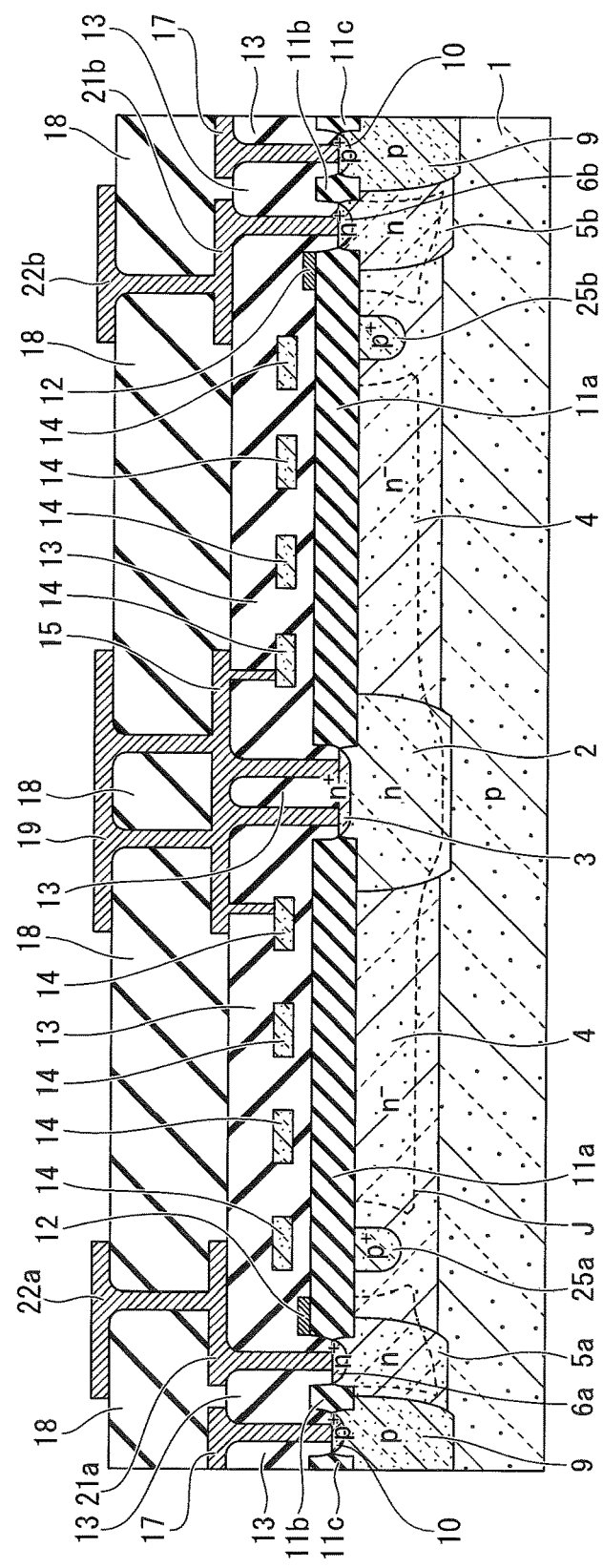
FIG. 15 is a schematic plan view illustrating a state in which the channel in the surge-current guiding-region is pinched off during normal operation in a modification (a fourth modification) of the semiconductor device according to the second embodiment.

A semiconductor device according to still another modification of the second embodiment (fourth modification) may include second p-type regions 25a and 25b, as pinch-off assisting regions, provided adjacent to the surge-current guiding-regions 5a and 5b at the upper portion of the drift layer 4 and having a higher impurity concentration of p$^+$ than the gate region 9, as illustrated in FIG. 15. Although not illustrated in FIG. 15, the gate region 9 includes the first concave patterns 9a1, 9a2 and the second concave patterns 9b, as illustrated in FIG. 1, and the n-type surge-current guiding-regions 5a and 5b contact with the drift layer 4 and the gate region 9 in the inner side of the second concave patterns. The surge-current guiding contact-regions 6a and 6b are provided at the top surface and in the surge-current guiding-regions 5a and 5b, and the surge-current guiding-regions 5a and 5b are connected to the ground potential via the surge-current guiding contact-regions 6a and 6b.

The second p-type regions 25a and 25b are not provided between the first concave patterns and the drain region 2, but provided only between the second concave patterns and the drain region 2. The second p-type regions 25a and 25b adjust the p-type impurity concentration around the second concave patterns to be higher than the p-type impurity concentration around the first concave patterns. Upon the reverse bias, pairs of the depletion layers J spreading between the second p-type regions 25a, 25b and the drift layer 4 joins with pairs of the depletion layers J spreading between the semiconductor substrate 1 and the drift layer 4 in the vertical direction, so that the pinch-off occurs in the drift layer 4. Although not illustrated in FIG. 15, the pinch-off also occurs in the drift layer 4 at the entrances of the U-shapes of the second concave patterns.

The second p-type regions 25a and 25b pinch off in the drift layer 4 at the entrances of the U-shapes of the second concave patterns earlier than in the drift layer 4 at the entrances of the U-shapes of the first concave patterns. The second p-type regions 25a and 25b each correspond to "the pinch-off assisting region" provided around the second concave patterns according to the present invention. The other elements in the semiconductor device according to the fourth modification are the same as in the semiconductor device as described with reference to FIG. 1 to FIG. 14, and duplicate description will be omitted.

The semiconductor device according to the fourth modification includes the grounded surge-current guiding-regions in the second concave patterns, so as to release a large current caused by the ESD surge to the outside, as in the case of the semiconductor device according to the first embodiment. Accordingly, in the fourth modification, it is possible to achieve a semiconductor device capable of minimizing device size and enhancing SWC.

Further, according to the semiconductor device of the fourth modification, the second p-type regions 25a and 25b adjust the p-type impurity concentration in the region around the second concave patterns to a higher level than the p-type impurity concentration around the first concave patterns, so that the pinch-off occurs on the surge-current guiding-region side earlier than on the source region side. A current flowing through the surge-current guiding-regions thus can be cut off when the pinch-off occurs on the source region side, so that a wasteful consumption of the current flowing to the ground via the surge-current guiding-regions can be minimized. The other effects in the semiconductor device according to the fourth modification are the same as in the semiconductor device as described with reference to FIG. 1 to FIG. 14.

As mentioned above, in the second embodiment, the first concave patterns 9a1 and 9a2 and the second concave patterns 9c have the entrances of the U-shapes with the same width w1. In order to ensure that the pinch off occurs on the surge-current guiding-region side earlier than on the source region side, the width of the entrances of the U-shapes of the second concave pattern 9b may be the width w2 which is smaller than the width w1 of the first concave patterns 9a1 and 9a2, as in the case of the first embodiment.

<Other Embodiments>

While the present invention has been described above by reference to the first and second embodiments, it should be understood that the present invention is not intended to be limited to the descriptions of the Specification and the drawings implementing part of this disclosure. Various alternative embodiments, examples, and technical applications will be apparent to those skilled in the art according to this disclosure.

For example, although the source regions and the surge-current guiding-regions are arranged on the circle in the planar pattern, the arrangement is not limited to the circular pattern, and may be varied as appropriate, such as a race-track pattern including two straight parts parallel to each other and arc-like parts connecting the two straight parts to both ends. A number of the source regions and the surge-current guiding-regions is not limited to a number illustrated herein, and may be varied as appropriate as long as a sufficient amount of current flowing through the starter circuit necessary for the semiconductor device can be ensured.

The first and second embodiments have exemplified the case in which the pinch-off occurs at the entrances of the U-shapes of the second concave patterns in which the surge-current guiding-regions are provided, earlier than at the entrances of the U-shapes of the first concave patterns in which the source regions are provided. The present invention is not intended to be limited to this case as long as the pinch-off occurs at the entrances of the U-shapes of the second concave patterns at least simultaneously with the pinch-off at the entrances of the U-shapes of the first concave patterns so as to cut off the current at the timing appropriate for the starter element.

The embodiments of the present invention have exemplified the semiconductor device which is a JFET as a starter element. The present invention is not intended to be limited to the JFET, and may be applied to any junction transistor such as a junction static induction transistor (JSIT) and the like.

The elements included in the respective semiconductor devices illustrated in FIG. 1 to FIG. 15 may partly be combined together to provide a semiconductor device according to the present invention. It should be noted that the present invention includes various embodiments which are not disclosed herein. Therefore, the scope of the present invention is defined only by the present invention specifying matters according to the claims reasonably derived from the description heretofore.

What is claimed is:

1. A semiconductor device comprising:
   a semiconductor substrate of a first conductivity type;
   a drift layer of a second conductivity type provided on the semiconductor substrate;
   a drain region of the second conductivity type in contact with the drift layer to be provided on the semiconductor substrate at a center of the drift layer;

a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern;

source regions of the second conductivity type provided in an inner side of the first concave patterns, each of the source regions contacts with the drift layer and the gate region; and surge-current guiding-regions of the second conductivity type provided in an inner side of the second concave patterns, each of the surge-current guiding-regions contacts with the drift layer and the gate region.

2. The semiconductor device of claim 1, wherein:
each of the second concave patterns is interposed between a pair of the first concave patterns; and
pinch-off occurs at the entrances of the U-shapes of the second concave patterns between the pair of the first concave patterns when a reverse bias is applied to a p-n junction formed between the gate region and the source regions.

3. The semiconductor device of claim 2, wherein:
each width of the entrances of the U-shapes of the second concave patterns is narrower than each width of the entrances of the U-shapes of the first concave patterns; and
the pinch-off occurs at the entrances of the U-shapes of the second concave patterns earlier than at the entrances of the U-shapes of the first concave patterns when the reverse bias is applied.

4. The semiconductor device of claim 3, wherein each width of the surge-current guiding-regions measured in a direction vertical to a direction toward the outer side is wider than the width of the entrances of the U-shapes of the second concave patterns.

5. The semiconductor device of claim 2, further comprising a pinch-off assisting region provided around the entrance of the U-shape of each of the second concave patterns,
wherein an impurity concentration of the pinch-off assisting region is adjusted so that the pinch-off occurs at the entrances of the U-shapes of the second concave patterns earlier than at the entrances of the U-shapes of the first concave patterns when the reverse bias is applied.

6. The semiconductor device of claim 5, wherein:
the drift layer extends to the inner side of the first concave patterns in the planar pattern, and the drift layer has a lower impurity concentration than the source regions and the surge-current guiding-regions; and
the pinch-off assisting region of second conductivity type is provided at a site between each entrances of the U-shapes of the second concave patterns and each surge-current guiding-region, the pinch-off assisting region has an area larger than an area of the drift layer allocated in the inner side of the first concave patterns and having an impurity concentration lower than or equal to the impurity concentration of the drift layer.

7. The semiconductor device of claim 5, wherein:
the drift layer extends to the inner side of the first concave patterns and has a lower impurity concentration than the source regions and the surge-current guiding-regions; and
the pinch-off assisting region of second conductivity type is provided at a site between each entrances of the U-shapes of the second concave patterns and each surge-current guiding-region, the length of the pinch-off assisting region measured between the entrances and the surge-current guiding-region is longer than a distance between each entrances of the U-shapes of the first concave patterns and each source region, and the pinch-off assisting region has an impurity concentration lower than or equal to the impurity concentration of the drift layer.

8. The semiconductor device of claim 6, wherein the pinch-off assisting region is assigned in each of the drift layer extending into to the inner sides of the second concave patterns.

9. The semiconductor device of claim 6, wherein the pinch-off assisting region is a layer having a lower impurity concentration than the drift layer.

10. The semiconductor device of claim 5, the pinch-off assisting region of first conductivity type is provided between the drift layer and the gate region at a position corresponding to an inner wall of the respective second concave patterns, the pinch-off assisting region having a higher impurity concentration than the gate region.

11. The semiconductor device of claim 5, the pinch-off assisting region is provided adjacent to the respective surge-current guiding-regions at an upper portion of the drift layer.

12. The semiconductor device of claim 1, further comprising:
a gate wire electrically connected to the gate region;
a source wire electrically connected to the respective source regions;
a drain wire electrically connected to the drain layer, and
a surge-current guiding-electrode electrically connected to the respective surge-current guiding-regions.

13. The semiconductor device of claim 12, wherein the gate wire and the surge-current guiding-electrode are connected together.

14. The semiconductor device of claim 12, wherein the gate wire and the surge-current guiding-electrode are electrically connected to ground potential.

15. A starter circuit comprising a semiconductor device, the semiconductor device including:
a semiconductor substrate of a first conductivity type;
a drift layer of a second conductivity type provided on the semiconductor substrate;
a drain region of the second conductivity type in contact with the drift layer to be provided on the semiconductor substrate at a center of the drift layer;
a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern;
source regions of the second conductivity type provided in an inner side of the first concave patterns, each of the source regions contacts with the drift layer and the gate region; and
surge-current guiding-regions of the second conductivity type provided in an inner side of the second concave patterns, each of the surge-current guiding-regions contacts with the drift layer and the gate region.

16. A switched-mode power-supply circuit comprising a starter circuit having a semiconductor device, the semiconductor device including:
a semiconductor substrate of a first conductivity type;

a drift layer of a second conductivity type provided on the semiconductor substrate;

a drain region of the second conductivity type in contact with the drift layer to be provided on the semiconductor substrate at a center of the drift layer;

a gate region of the first conductivity type provided on the semiconductor substrate in an outer side of the drift layer, the gate region including U-shaped first and second concave patterns in a planar pattern, each of which having entrances of the U-shapes located with equal distances from the drain region, the bottoms of the U-shapes protruding toward an outer side of the planar pattern;

source regions of the second conductivity type provided in an inner side of the first concave patterns, each of the source regions contacts with the drift layer and the gate region; and surge-current guiding-regions of the second conductivity type provided in an inner side of the second concave patterns, each of the surge-current guiding-regions contacts with the drift layer and the gate region.

* * * * *

UNITED STATES PATENT AND TRADEMARK OFFICE
CERTIFICATE OF CORRECTION

PATENT NO. : 10,483,347 B2  
APPLICATION NO. : 16/046490  
DATED : November 19, 2019  
INVENTOR(S) : Taichi Karino Page 1 of 1

It is certified that error appears in the above-identified patent and that said Letters Patent is hereby corrected as shown below:

In the Specification

Column 1, Line 9 (approx.), after "claims benefit" delete "to" and insert -- of --, therefor.

Signed and Sealed this
Twenty-first Day of January, 2020

Andrei Iancu
*Director of the United States Patent and Trademark Office*